(12) United States Patent
Song et al.

(10) Patent No.: US 7,858,971 B2
(45) Date of Patent: Dec. 28, 2010

(54) ORGANIC THIN FILM TRANSISTOR SUBSTRATE AND METHOD OF FABRICATING THE SAME

(75) Inventors: Keun Kyu Song, Gyeonggi-Do (KR); Seung Hwan Cho, Gyeonggi-do (KR); Bo Sung Kim, Seoul (KR); Young Min Kim, Gyeonggi-do (KR); Jung Han Shin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 532 days.

(21) Appl. No.: 11/777,174

(22) Filed: Jul. 12, 2007

(65) Prior Publication Data
US 2008/0012024 A1 Jan. 17, 2008

(30) Foreign Application Priority Data
Jul. 12, 2006 (KR) .................. 10-2006-0065343

(51) Int. Cl.
*H01L 51/00* (2006.01)
(52) U.S. Cl. .................. 257/40; 257/E51.006; 313/504
(58) Field of Classification Search .................. 257/40, 257/E51.006, E51.033; 313/504, 505; 345/205
See application file for complete search history.

(56) References Cited

U.S. PATENT DOCUMENTS

2002/0128515 A1* 9/2002 Ishida et al. .................. 564/435
2004/0023447 A1 2/2004 Hirakata et al.
2004/0247814 A1* 12/2004 Sirringhaus et al. ........ 428/64.1
2005/0140260 A1* 6/2005 Park et al. .................... 313/292
2006/0102905 A1 5/2006 Park

FOREIGN PATENT DOCUMENTS

| CN | 1638563 A | 7/2005 |
|---|---|---|
| CN | 1783508 A | 6/2006 |
| EP | 1605507 A2 * | 12/2005 |
| GB | 2420651 A * | 5/2006 |
| JP | 2006-093332 A | 4/2006 |
| KR | 10-2004-0049110 A | 6/2004 |
| KR | 10-2005-0023012 A | 3/2005 |

OTHER PUBLICATIONS

EP07013459, Réponse À la notification de la division d'examen, Nov. 10, 2009.*
Klauk et al., "Pentacene thin film transistors and inverter circuits" Electron Devices Meeting, 1997, Technical Digest, New York, NY, USA, IEEE, US, Dec. 7, 1997, pp. 539-542.*

* cited by examiner

*Primary Examiner*—Thomas L Dickey
(74) *Attorney, Agent, or Firm*—Innovation Counsel LLP

(57) ABSTRACT

An organic TFT substrate includes a gate line on a substrate, a pixel electrode in a same plane of the gate line, a data line insulated from the gate line, an organic TFT including a gate electrode connected to the gate line, a source electrode connected to the data line and insulated from the gate line, a drain electrode connected to the pixel electrode and insulated from the gate electrode, and an organic semiconductor layer contacting each of the source and drain electrodes, and a gate-insulating layer on the gate line and the gate electrode.

21 Claims, 26 Drawing Sheets

ORGANIC THIN FILM TRANSISTOR SUBSTRATE AND METHOD OF FABRICATING THE SAME

CROSS REFERENCE TO RELATED APPLICATIONS

This application claims priority of Korean Patent Application No. 2006-65343 filed on Jul. 12, 2006 and all the benefits accruing therefrom under 35 U.S.C. §119, the contents of which are herein incorporated by reference in their entirety.

BACKGROUND OF THE INVENTION

1. Field of the Invention

The present invention relates to liquid crystal displays and, more particularly, to a display having an improved organic thin film transistor ("TFT") substrate.

2. Discussion of the Related Art

Generally, a liquid crystal display ("LCD") displays an image by adjusting the light transmissivity of liquid crystals having dielectric anisotropy using an electric field. An LCD comprises an LCD panel and a driving circuit that employs a TFT as a switching device for supplying a pixel signal to each liquid crystal cell independently. Amorphous silicon ("amorphous-Si") or polycrystalline silicon ("poly-Si") is used as an active layer of the TFT.

An amorphous-Si or poly-Si active layer is patterned by a complicated, time-consuming process requiring thin film deposition (coating), photolithography, and etch which increase fabrication costs.

SUMMARY OF THE INVENTION

According to one aspect of the present invention, a liquid crystal display employs an organic TFT substrate having a TFT exhibiting improved on/off characteristics.

An organic TFT substrate according to the present invention includes a gate line on a substrate, a pixel electrode in the same plane as the gate line, a data line insulated from the gate line, an organic TFT including a gate electrode connected to the gate line, a source electrode connected to the data line that is insulated from the gate line, a drain electrode connected to the pixel electrode that is insulated from the gate electrode, and an organic semiconductor layer contacting each of the source and drain electrodes, and a gate-insulating layer on the gate line and the gate electrode.

Preferably, the gate line and the gate electrodes are configured to have a double-layer structure including a first conductive layer and a second conductive layer stacked on the first conductive layer. The first conductive layer may advantageously comprise a transparent conductive layer and the second conductive layer an opaque metal layer. The pixel electrode may be formed of the same substance as the gate line.

Preferably, the gate-insulating layer is formed on the pixel electrode overlapping the drain electrode of the organic TFT and the pixel electrode and the drain electrode may be connected to each other via a contact hole formed in the gate-insulating layer.

Preferably, the gate-insulating layer is formed of an inorganic substance such as silicon nitride ($SiN_x$). Alternatively, the gate-insulating layer may be formed of an organic substance.

Preferably, the data line is configured to have a multi-layer structure of at least two layers including a transparent conductive layer. For example, the data line may include a third conductive layer comprising the transparent conductive layer and a fourth conductive layer on the third conductive layer to be formed of an opaque metal so that the source and drain electrodes of the organic TFT are formed of the same substance as the third conductive layer of the data line.

Preferably, the gate-insulating layer is formed of the organic substance selected from a group consisting of polyvinyl pyrrolidone (PVP), polyvinyl acetate (PVA), phenol based polymer, acryl based polymer, imide based polymer, allyl ether based polymer, amide based polymer, fluorine based polymer, and vinyl alcohol based polymer.

In another aspect of the present invention, a method of fabricating an organic TFT substrate includes forming a gate line, a gate electrode, and a pixel electrode on a substrate, forming a gate-insulating layer on the gate line and the gate electrode, forming a data line, a source electrode connected to the gate line, and a drain electrode connected to the pixel electrode on the gate-insulating layer, and forming an organic semiconductor layer between the source and drain electrodes.

Preferably, the gate line and the gate electrode are formed on the substrate to have a double-layer structure including a first conductive layer and a second conductive layer stacked on the first conductive layer and a gate-insulating layer that includes an inorganic substance, for example, silicon nitride ($SiN_x$).

Preferably, the forming of the gate-insulating layer includes forming a contact hole on the pixel electrode.

Preferably, the method further includes forming a bank-insulating layer provided with a hole to be filled with the organic semiconductor layer before forming the organic semiconductor layer and forming an organic passivation layer within the hole filled with the organic semiconductor layer.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
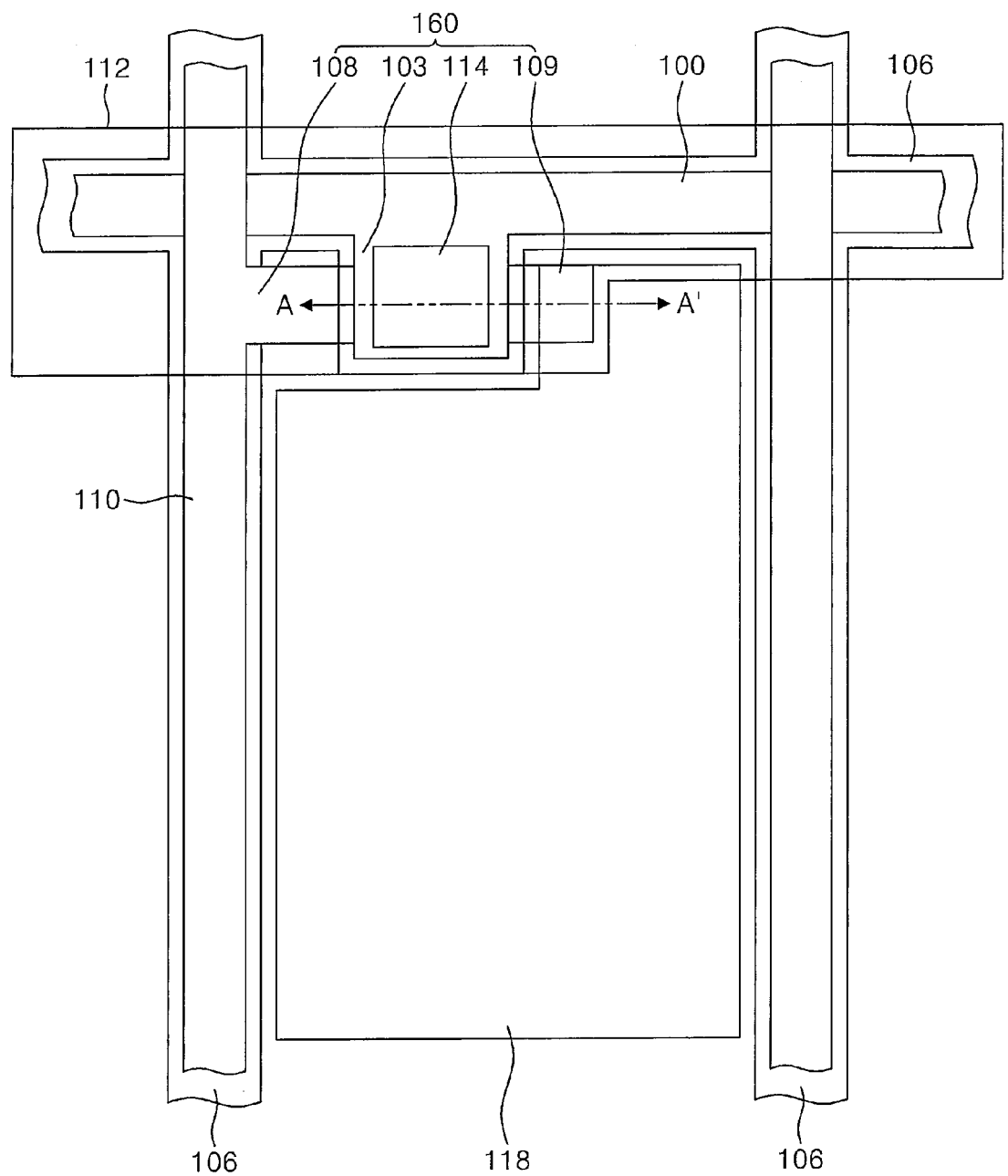
FIG. 1 and FIG. 2 are a layout and a cross-sectional diagram of an organic TFT substrate according to a first embodiment of the present invention, respectively.
Figure 2:
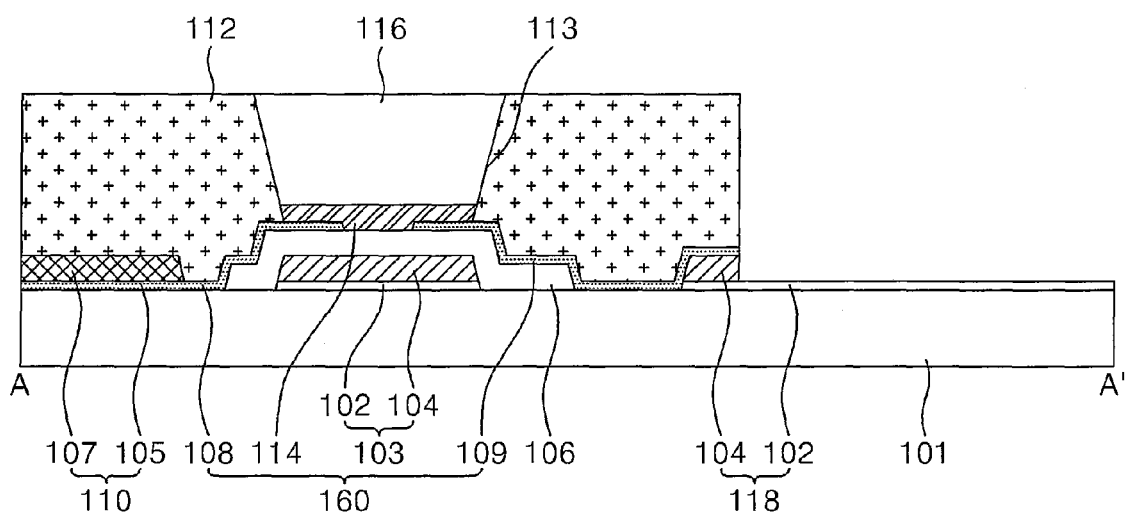

FIG. 1 and FIG. 2 are a layout and a cross-sectional diagram of an organic TFT substrate according to a first embodiment of the present invention, respectively.

Referring to FIG. 1 and FIG. 2, an organic TFT substrate according to a first embodiment of the present invention includes gate and data lines 100 and 110 crossing with each other on a substrate 101 with a gate-insulating layer 106 in-between. An organic TFT 160 is connected to the gate line 10 and the data line 110. The organic TFT substrate includes a pixel electrode 118 provided in a sub-pixel area. The sub-pixel area may be defined by the gate and data lines 100 and 110 crossing each other.

The gate line is supplied with a scan signal from a gate driver (not shown in the drawings). The gate line 100 has a double-layer structure configured with a first conductive layer 102 on the substrate 101 and a second conductive layer 104 stacked on the first conductive layer 102. For instance, the first conductive layer 102 of the gate line 100 includes a transparent conductive layer and the second conductive layer 104 includes an opaque metal layer. The first conductive layer 102 is formed of ITO (indium tin oxide), TO (tin oxide), IZO (indium zinc oxide), ITZO (indium tin zinc oxide), or the like. The second conductive layer 104 is formed of Cu, Mo, Al, Cu alloy, Mo alloy, Al alloy, or the like. The gate-insulating layer 106 is patterned by photolithography to reveal the gate pad.

The data line 110 is supplied with a pixel signal by a data driver (not shown in the drawings). The data line 110 has a multi-layer configuration with at least two layers including a transparent conductive layer on the gate-insulating layer 106. A third conductive layer 105 of transparent material and a fourth conductive layer 107 is formed of an opaque metal stacked on the third conductive layer 105. The third conductive layer 105 is formed of ITO, TO, IZO, ITZO, or the like and the fourth conductive layer 107 is formed of Cu, Mo, Al, Cu alloy, Mo alloy, Al alloy, or the like.

The gate-insulating layer 106 is provided to enhance the on-off characteristics of the organic TFE with respect to the on-current, Ion, and the off-current, Ioff. The gate-insulating layer 106 advantageously includes an inorganic insulating layer formed of inorganic substance. Preferably, the organic insulating layer is formed of silicon nitride ($SiN_x$).

Alternatively, the gate-insulating layer 106 can be formed using an organic insulating layer formed of organic substance selected from the group consisting of polyvinyl pyrrolidone (PVP), polyvinyl acetate (PVA), phenol based polymer, acryl based polymer, imide based polymer, allyl ether based polymer, amide based polymer, fluorine based polymer, and vinyl alcohol based polymer.

The gate-insulating layer 106 is provided between the gate line 100 and the data line 110 and between a gate electrode 103 and source and drain electrodes 108 and 109.

The organic TFT 160 enables the pixel electrode 118 to be charged with and sustain the pixel signal supplied to the data line 110. The organic TFT 160 includes the gate electrode 103, the source electrode 108 connected to the data line 110, and the drain electrode 109 opposing the source electrode 108 to be connected to the pixel electrode 118. The organic TFT 160 further includes an organic semiconductor layer 114 overlapping the gate electrode 106 and separated therefrom by the gate-insulating layer 106 to establish a channel between the source and drain electrodes 108 and 110.

The gate electrode 103 has the same configuration and is made of the same substance as the gate line 100. The gate electrode 103 includes the first conductive layer 102 of the transparent conductive layer and the second conductive layer 104 of the opaque metal layer. Each of the source and drain electrodes 108 and 109 includes the third conductive layer 105 of the data line 114 formed of ITO, TO, IZO, ITZO, or the like. The organic semiconductor layer 114 is formed within a hole 113 provided by the source and drain electrodes 108 and 109 and a bank-insulating layer 112 in an area overlapping the gate electrode 103.

The organic semiconductor layer 114 is formed of an organic semiconductor such as pentacene, tetracene, anthracene, naphthalene, α-6T, α-4T, perylene and derivative thereof, rubrene and derivative thereof, coronene and derivative thereof, perylene tetracarboxylic diimide and derivative thereof, perylenetetracarboxylic dianhydride and derivative thereof, phthalocyanine and derivative thereof, naphthalene tetracarboxylic diimide and derivative thereof, naphthalene tetracarboxylic dianhydride and derivative thereof, a diolefin polymer derivative containing substituted or non-substituted thiophene, a diolefin polymer derivative containing substituted fluorine, etc.

The organic semiconductor layer 114 comes into ohmic contact with each of the source and drain electrodes 108 and 109 by self-assembled monolayer ("SAM") processing. The work function difference between the organic semiconductor layer 114 and each of the source and drain electrodes 108 and 109 is reduced by the SAM processing. So, hole injection into the organic semiconductor layer 114 from the source or drain electrode 108 or 109 is facilitated and the contact resistance between the organic semiconductor layer 114 and each of the source and drain electrodes 108 and 109 is reduced.

The organic passivation layer 116 protects the organic TFT 160. And, the organic passivation layer 116 is formed within the hole 113 provided by the bank-insulating layer 112.

The bank-insulating layer 112 is configured to provide the hole 113. The hole 113 provided by the bank-insulating layer 113 reveals the source and drain electrodes 108 and 109. A portion of the source and drain electrodes 108 and 109 revealed through the bank-insulating layer 112 is overlaps the organic semiconductor layer 116.

The pixel electrode 118 is configured to include the first and second conductive layers 102 and 104 like the gate electrode 103 so that the pixel electrode 118 is connected to an extension of the drain electrode 109. The second conductive layer 104 is formed under the drain electrode 109 in the sub-pixel area, whereas the first conductive layer 102 is formed under the drain electrode 109 and in the whole sub-pixel area.

The second layer 104 of the pixel electrode 118 includes the opaque metal layer to raise conductivity between the transparent layer used as the third conductive layer 105 of the drain electrode 109 and the transparent conductive layer used as the first conductive layer 102 of the pixel electrode 118. The pixel electrode 118 supplies a voltage to the liquid crystals provided between the organic TFT substrate and a color filter substrate (not shown in the drawings).

Figure 3A:
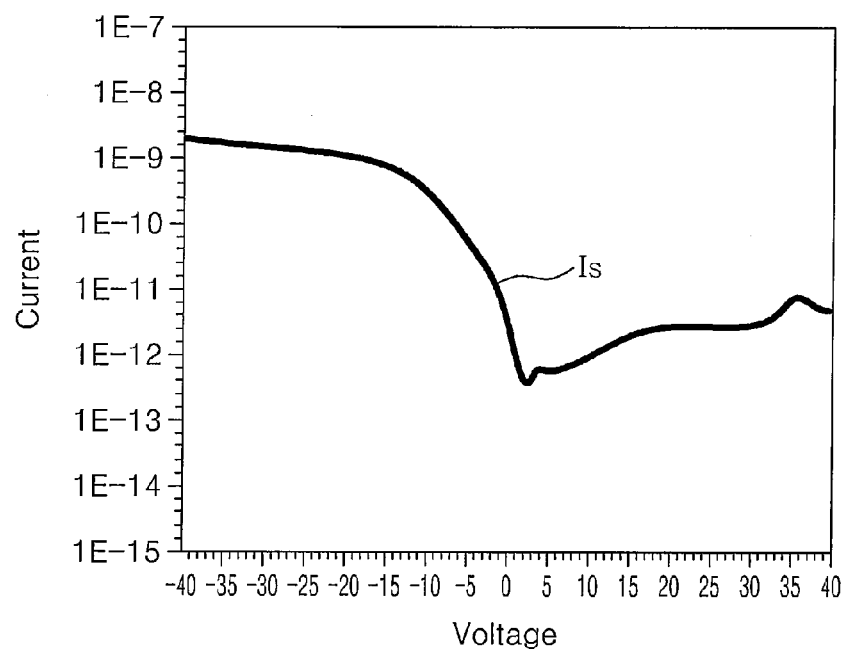
FIG. 3A and FIG. 3B are graphs to compare characteristics between organic TFTs using organic and inorganic insulating layers as gate-insulating layers, respectively.
Figure 3B:
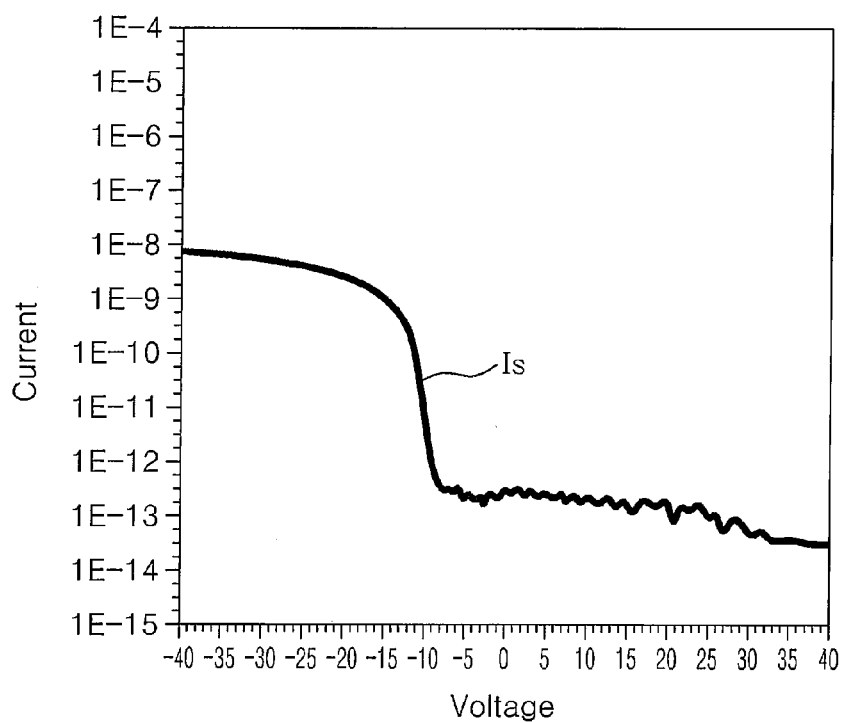

FIG. 3A and FIG. 3B are graphs to compare characteristics between organic TFTs using organic and inorganic insulating layers as gate-insulating layers, respectively.

The graphs shown in FIG. 3A and FIG. 3B illustrate the variation of gate-on/off voltage (Von/Voff) to on/off current (Ion/Ioff) of the organic TFT. The x-axis represents the gate-on/off voltage (Von/Voff) and the y-axis represents the on/off current (Ion/Ioff) of the organic TFT.

Referring to FIG. 3A, when a gate-on voltage Von, 40V is applied to an organic TFT, the organic TFT is turned on and source current Is flows stably. However, when a gate-off voltage Voff, −40V is applied to an organic TFT, the source current Is flows unstably, the organic TFT is turned off and only a low source current Is flows. Yet, if the gate-off voltage keeps being applied to the organic TFT, the source current Is increases to raise a voltage and so, the organic TFT turns on.

Referring to FIG. 3B, if a gate-on voltage Von, 40V is applied to an organic TFT using an inorganic gate-insulating layer such as silicon nitride (SiNx) gate-insulating, the organic TFT is turned on to enable a source current Is to flow stably. If a gate-off voltage of, for example, −40V is applied to the organic TFT, the organic TFT is turned off, and a source current IS barely flows. After a relatively high source current Is has been flowing through a source electrode of the organic TFT turned on by the gate-on voltage, if the gate-off voltage Voff is applied, the source current Is abruptly decreases and barely flows. Hence, since the organic TFT with an inorganic gate-insulating layer can be turned off by a relatively low gate-off voltage Voff, power consumption is reduced. When the gate-on voltage is applied to the organic TFT using the inorganic insulating layer, the on-current Ion of the turned-on organic TFT starts to flow. When the gate-off voltage is applied the off-current Ioff of the turned-off organic TFT barely flows and so the gate-off voltage is able to precisely switch the turn-off and turn-on operations of the organic TFT. Hence, using the inorganic insulating layer as the gate-insulating layer, enables the gate-on/off voltage Von/Voff to precisely discriminate the on/off current flowing through the source electrode of the organic TFT.

When using an organic material as the gate-insulating layer of the organic TFT, the off current Ioff may be unstable for the turn-off operation of the TFT However, using the inorganic gate-insulating layer, the off current Ioff becomes relatively low and stable. Hence, using the inorganic insulating layer as the gate-insulating layer is more advantageous than using the organic insulating layer. Yet, optionally, the gate-insulating layer can be formed of the organic insulating under prescribed circumstances.

Figure 4:
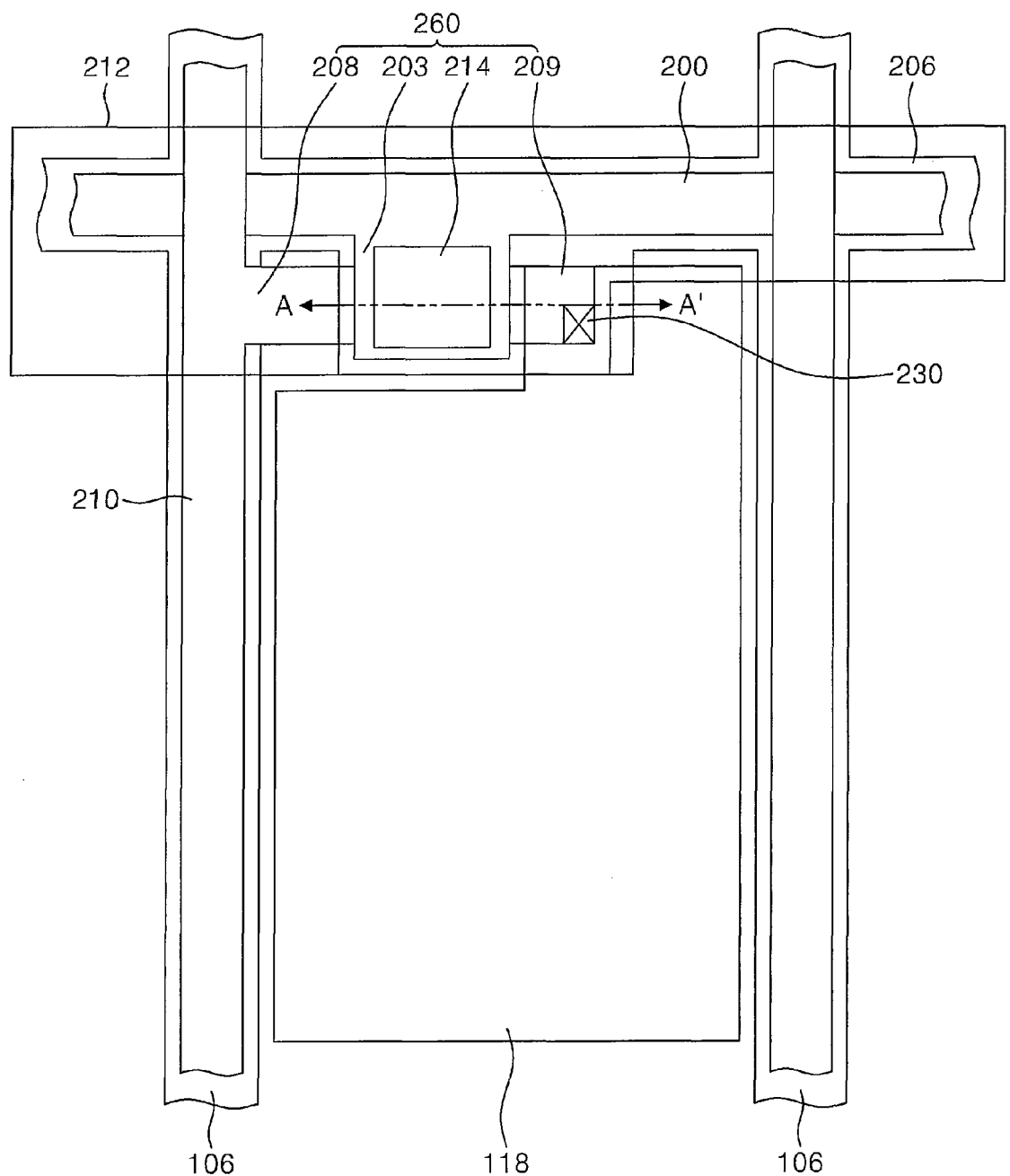
FIG. 4 and FIG. 5 are a layout and a cross-sectional diagram of an organic TFT substrate according to a second embodiment of the present invention, respectively.
Figure 5:
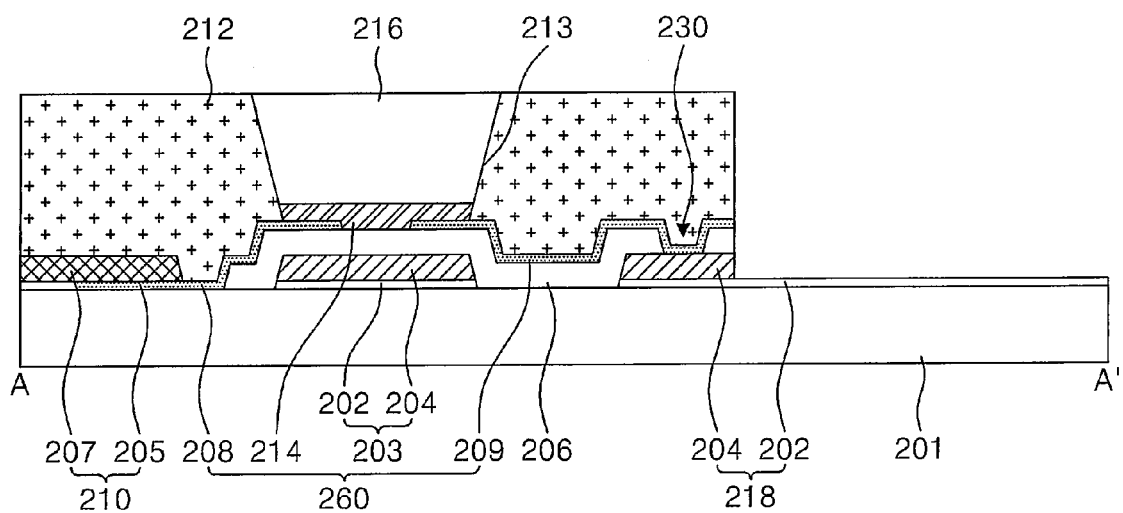

FIG. 4 and FIG. 5 are a layout and a cross-sectional diagram of an organic TFT substrate according to a second embodiment of the present invention, respectively.

The organic TFT substrate shown in FIG. 4 and FIG. 5 includes the same elements as the former organic TFT substrate shown in FIG. 1 and FIG. 2 except that a contact hole 230 is provided in gate-insulating layer 206. Accordingly, details of the identical elements will be omitted in the following description.

Referring to FIG. 4 and FIG. 5, an organic TFT substrate according to a second embodiment of the present invention includes a gate line 200, a pixel electrode 218, a data line 210, an organic TFT 260, and an organic passivation layer 216 over a substrate 201.

The gate line 200 crosses the data line 210. The gate line 200 has a double-layer configuration including a first conductive layer 202 on the substrate 210 and a second conductive layer 204 stacked on the first conductive layer 202. The first conductive layer 202 of the gate line 200 preferably includes a transparent conductive layer and the second conductive layer 204 preferably includes an opaque metal layer. The data line 210 has a multi-layer structure configured with at least two stacked layers including a transparent conductive layer and may include a third conductive layer 205 of a transparent conductive material and a fourth conductive layer 207 of an opaque metal material stacked on the third conductive layer 205.

The pixel electrode 218 is formed in the same plane as the gate line 200 or gate electrode 203 of the organic TFT 260. Like the gate line 200, the pixel electrode 218 has the double-layer structure including the first conductive layer 202 and the second conductive layer 204. The second conductive layer 204 is provided under a drain electrode 209 in a sub-pixel area, while the first conductive layer 202 is formed in the whole sub-pixel area. The pixel electrode 218 is connected to the drain electrode 209 via a contact hole 230.

The gate-insulating layer 206 insulates the gate line 200, the gate electrode 203, and the pixel electrode 218 from the data pattern including the data line 210, the source electrode 208, and the drain electrode 209. The gate-insulating layer 206 includes an organic insulating layer and an inorganic insulating layer to enhance the on-current Ion and off-current Ioff characteristics of the organic TFT 260.

The gate-insulating layer 206 is formed on the pixel electrode 218 including the first and second conductive layers 202 and 206. If the gate-insulating layer 206 is formed on the pixel electrode 218, it prevents the second conductive layer 204 of the pixel electrode 218 from being simultaneously etched when etching the drain electrode 209 of the organic TFT 260. The gate-insulating layer 206 is provided with the contact hole 230 so that the pixel electrode 218 is connected to the drain electrode 209 of the organic TFT via the contact hole 230.

The organic TFT 260 includes the gate electrode 203 connected to the gate line 200, the source electrode 208 connected to the data line 210, and the drain electrode 209 opposing the source electrode 208 connected to the pixel electrode 218. The organic TFT 260 further includes an organic semiconductor layer 214 overlapping the gate electrode 203 by leaving the gate-insulating layer 206 in-between to establish a channel between the source and drain electrodes 208 and 209. The organic semiconductor layer 214 is formed within a hole 213 configured by the source and drain electrodes 208 and 209 and a bank-insulating layer 212 in an area overlapping the gate electrode 203.

The organic passivation layer 216 protects the organic TFT 260 and is provided on the organic semiconductor layer 214 and within the hole 213 configured by the bank-insulating layer 212.

The bank-insulating layer 212 is provided to configure the hole 213 which exposes the source and drain electrodes 208 and 209; A portion of each of the source and drain electrodes exposed by the bank-insulating layer 212 is connected to the organic semiconductor layer 214.

A method of fabricating an organic TFT substrate according to a first embodiment of the present invention is explained in detail with reference to FIGS. 6 to 15D as follows.

Figure 6:
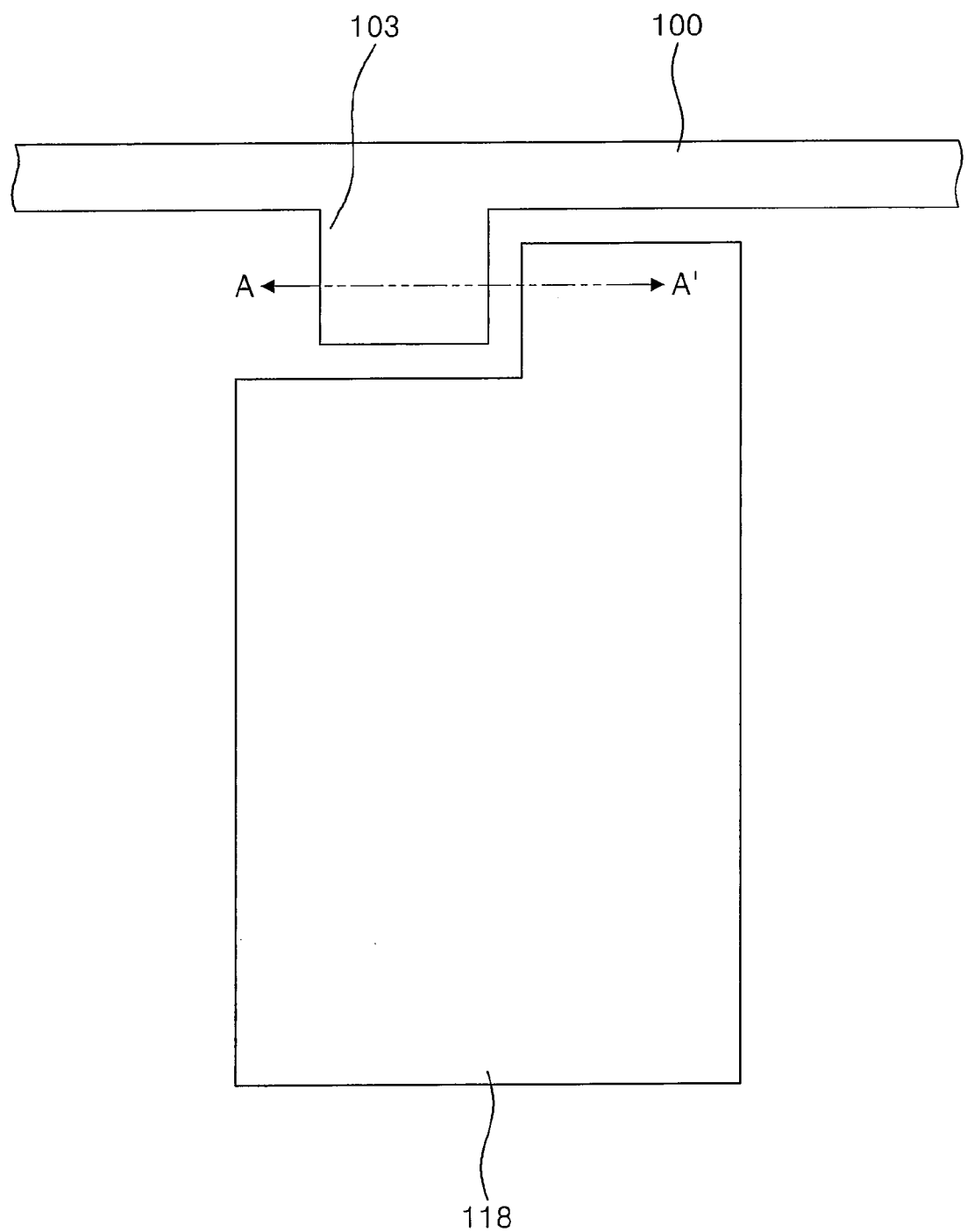
FIG. 6 and FIG. 7 are a layout and a cross-sectional diagram to explain a step of forming a metal gate pattern in a method of fabricating an organic TFT substrate according to a first embodiment of the present invention, respectively.
Figure 7:
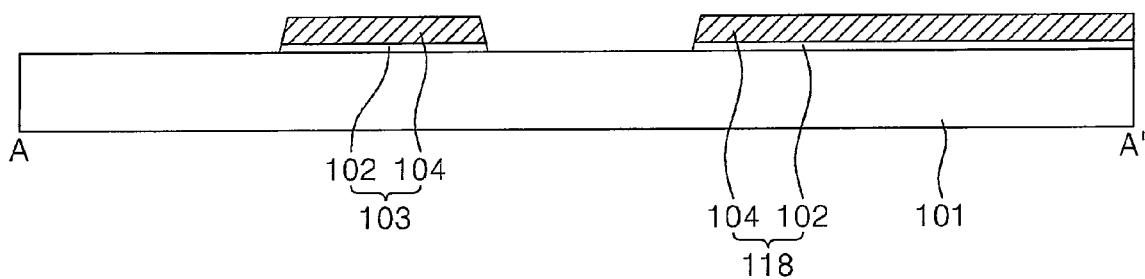

FIG. 6 and FIG. 7 are a layout and a cross-sectional diagram to explain the forming of a metal gate pattern in fabricating an organic TFT substrate according to a first embodiment of the present invention, respectively.

Referring to FIG. 6 and FIG. 7, a metal gate pattern including a gate line 100, a gate electrode 103, and a pixel electrode 118 is formed by stacking a first conductive layer 102 and a second conductive layer 104 sequentially on a substrate 101 by a first masking process.

The first conductive layer 102 and the second conductive layer 104 are sequentially deposited on the substrate 101 by sputtering. After the first and second conductive layers 102 and 104 have been stacked, a first mask pattern including the gate line 100, the gate electrode 103, and the pixel electrode 118 is formed by patterning the second and first conductive layers 104 and 102 by photolithography. The first conductive layer 102 is formed of amorphous ITO and the second conductive layer 104 is formed of Al, Mo, Cr, Cu, or the like to configure a double-layer structure.

Figure 8:
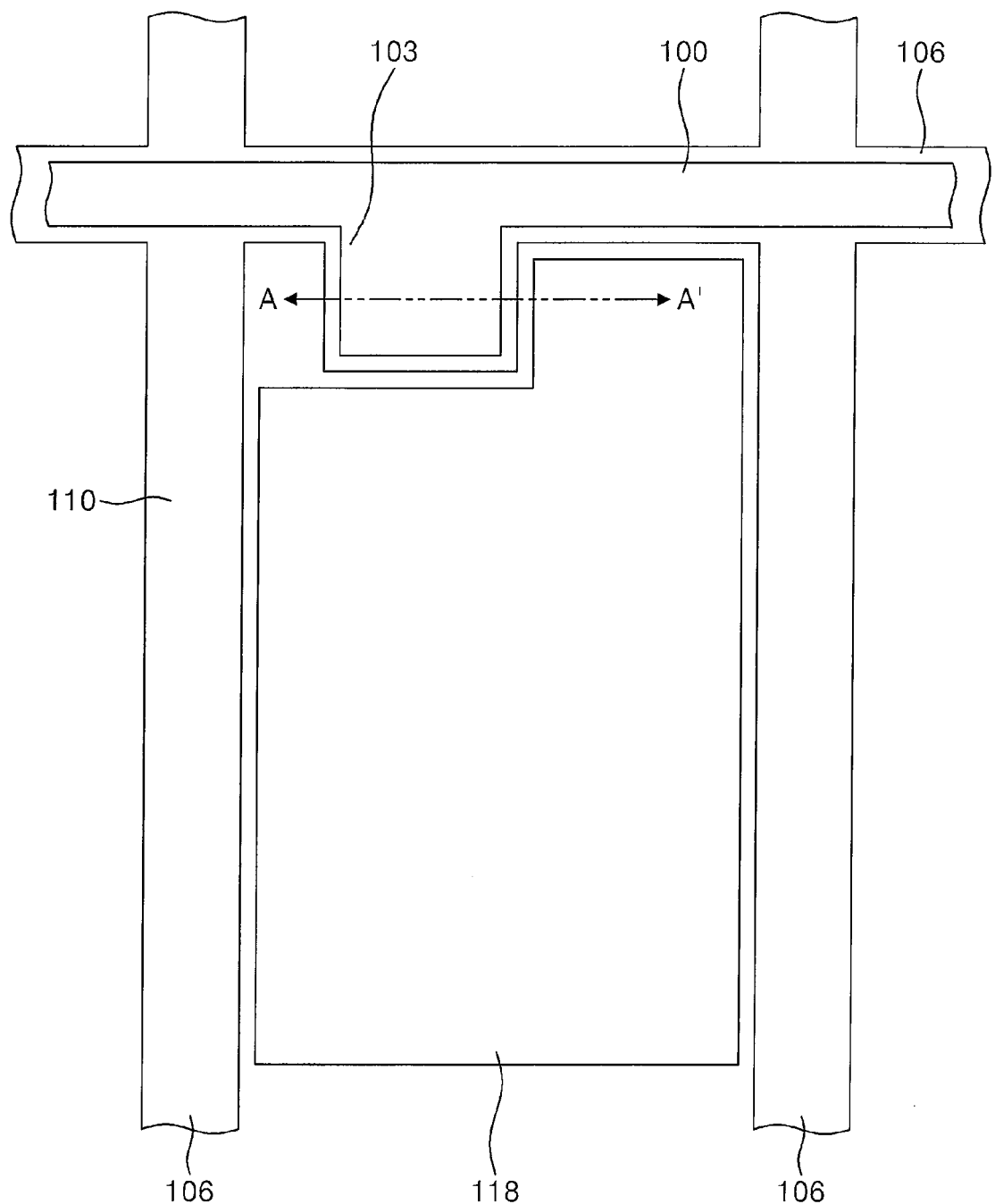
FIG. 8 and FIG. 9 are a layout and a cross-sectional diagram to explain a step of forming a gate-insulating layer in a method of fabricating an organic TFT substrate according to a first embodiment of the present invention, respectively.
Figure 9:
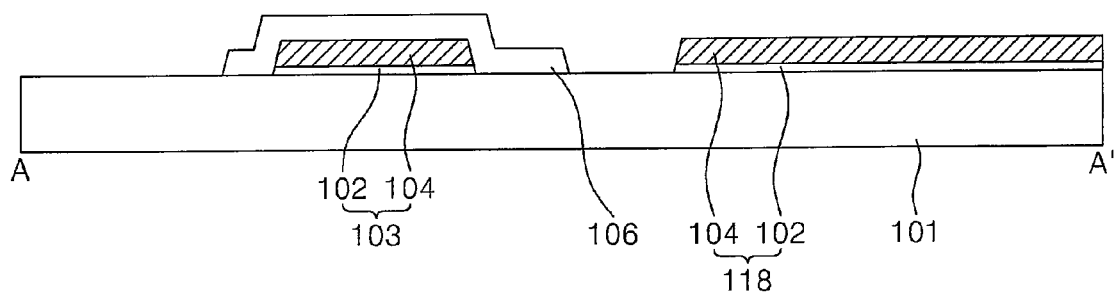

FIG. 8 and FIG. 9 are a layout and a cross-sectional diagram to explain a step of forming a gate-insulating layer in a method of fabricating an organic TFT substrate according to a first embodiment of the present invention, respectively.

Referring to FIG. 8 and FIG. 9, a gate-insulating layer 106 is formed on the substrate 101 including the metal gate pattern. An organic insulating substance is deposited on the substrate 101 including the metal gate pattern to form the gate-insulating layer 106. The gate-insulating layer 106 is formed of an inorganic insulating substance such as silicon nitride ($SiN_x$) by deposition such as plasma enhanced chemical vapor deposition ("PECVD") and the like. Alternatively, the gate-insulating layer 106 can be formed of an organic insulating substance such as PVP and the like by coating such as spin coating. The gate-insulating layer 106 on a gate pad connected to the gate line 100 is patterned by photolithography to reveal the gate pad and the substrate 101 in an area for forming the pixel electrode 118.

Figure 10:
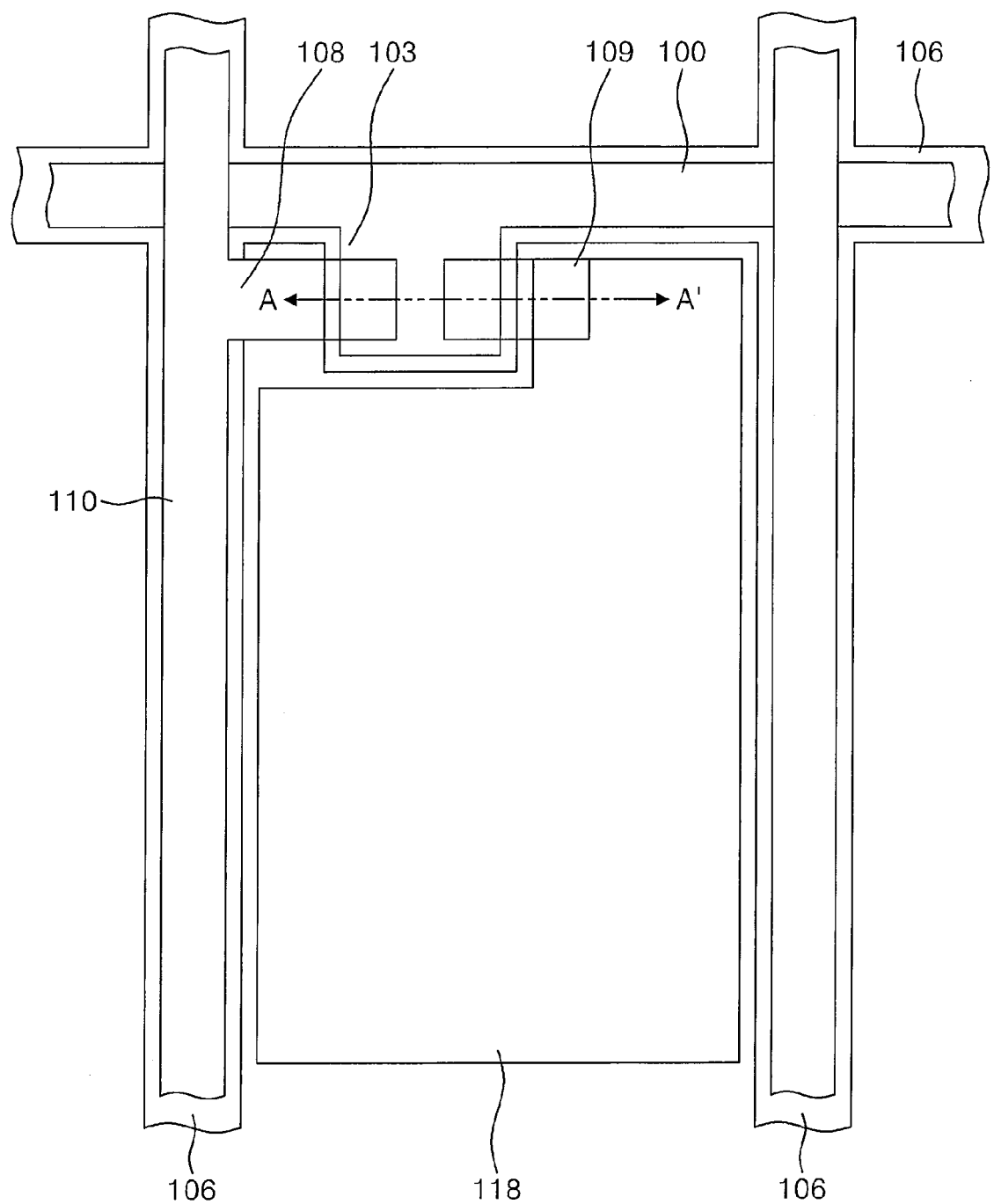
FIG. 10 and FIG. 11 are a layout and a cross-sectional diagram to explain steps of forming a data line, a source electrode, and a drain electrode in a method of fabricating an organic TFT substrate according to a first embodiment of the present invention, respectively.
Figure 11:
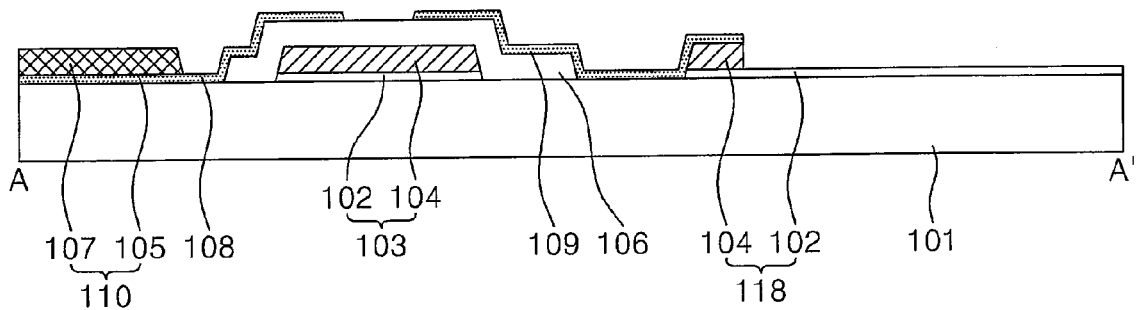

FIG. 10 and FIG. 11 are a layout and a cross-sectional diagram to explain steps of forming a data line, a source electrode, and a drain electrode in a method of fabricating an organic TFT substrate according to a first embodiment of the present invention, respectively, and FIGS. 12A to 12F are cross-sectional diagrams to explain details of the steps of forming the data line, source electrode and drain electrode shown in FIG. 10 and FIG. 11.

Figure 12A:
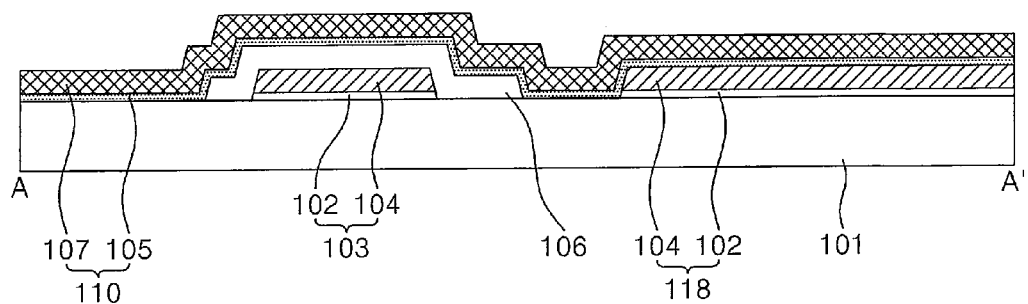
FIGS. 12A to 12F are cross-sectional diagrams to explain details of the steps of forming the data line, source electrode and drain electrode shown in FIG. 10 and FIG. 11.

Referring to FIG. 12A, a third conductive layer 105 and a fourth conductive layer 107 are stacked on the gate-insulating layer 106 by sputtering or the like. The third conductive layer 105 is formed of ITO, TO, IZO, ITZO, or the like and the fourth conductive layer 107 is formed of Cu, Mo, Al, Cu alloy, Mo alloy, Al alloy, or the like. Subsequently, after photoresist has been coated on the fourth conductive layer 107, first and second photoresist patterns 212a and 212b differing from each other in thickness, as shown in FIG. 12B, are formed by photolithography using a semitransparent or slit mask 140.

The slit mask 140 includes a shield area S11 having a shield layer 144 on a quartz substrate 142, a slit area S12 provided with a plurality of slits 146 on the quartz substrate 152, and a transmitting area S13 having the quartz substrate 142 only.

Figure 12B:
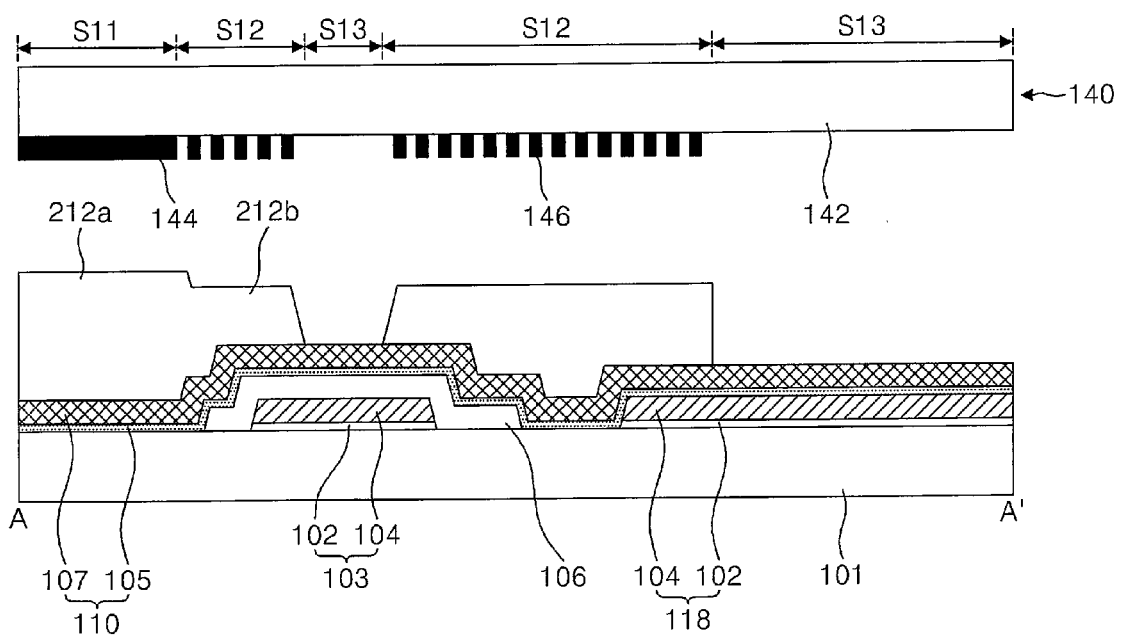

The shield area S11 is provided to an area for forming a data line 110 and cuts off UV-rays in the course of exposure to leave the first photoresist pattern 212a, as shown in FIG. 12B, only after completion of development. The slit area S12 is provided to an area for forming source and drain electrodes 108 and 109 and diffracts UV-rays in the course of the exposure to leave the second photoresist pattern 212b, as shown in FIG. 12B, thinner than the first photoresist pattern 212a after completion of the development. The transmitting area S13 enables UV-rays to be entirely transited to remove the photoresist, as shown in FIG. 12B.

Figure 12C:
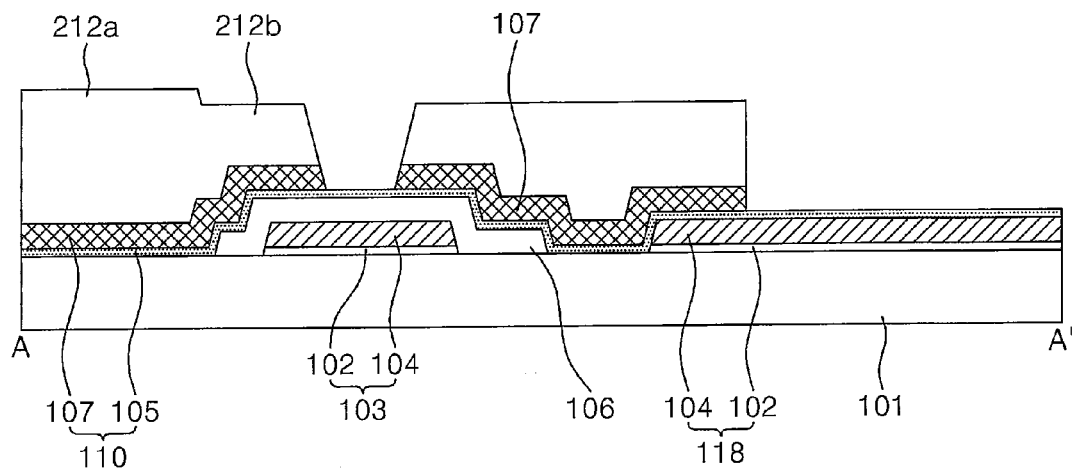
Figure 12D:
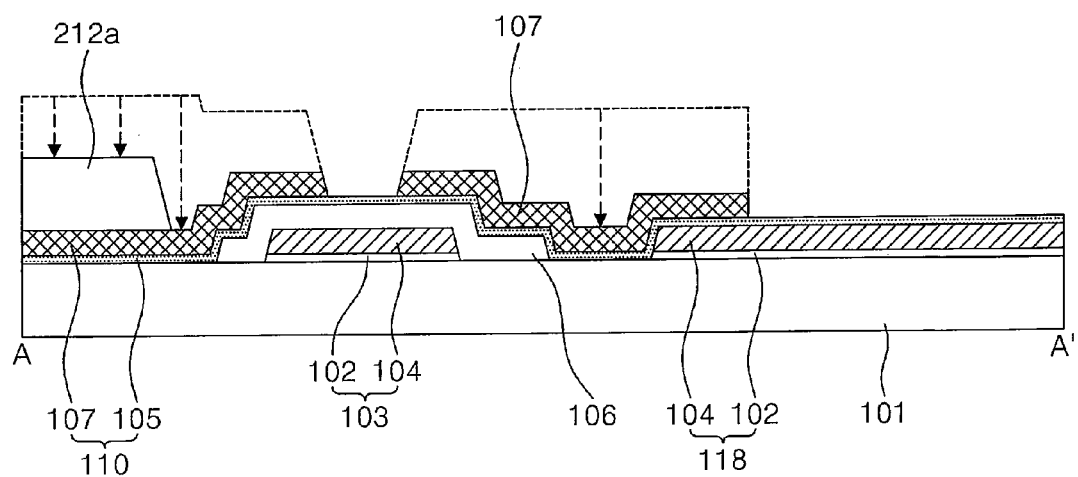
Figure 12E:
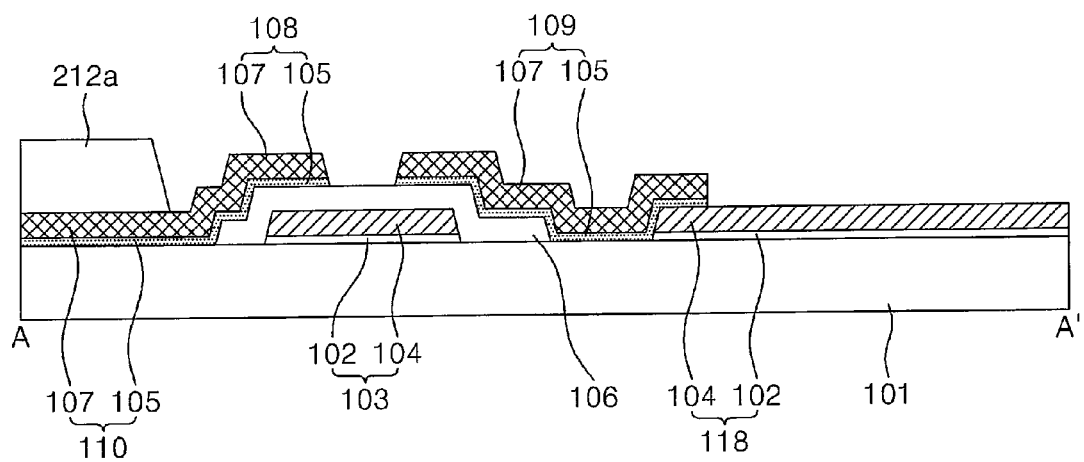

The fourth conductive layer 107, as shown in FIG. 12C, is patterned by a first etch process using the first and second photoresist patterns 212a and 212b as a mask to reveal the third conductive layer. Ashing is then carried out using $O_2$ plasma, whereby the thickness of the first photoresist pattern 212a, as shown in FIG. 12D, is reduced and whereby the second photoresist pattern 212b is removed. And, the third conductive layer 105, as shown in FIG. 12E, is removed by a second etch process using the ashed first photoresist pattern 212a as a mask. Thus, a data line and source and drain electrodes 108 and 109 including the third and fourth conductive layers 105 and 107 are formed.

Figure 12F:
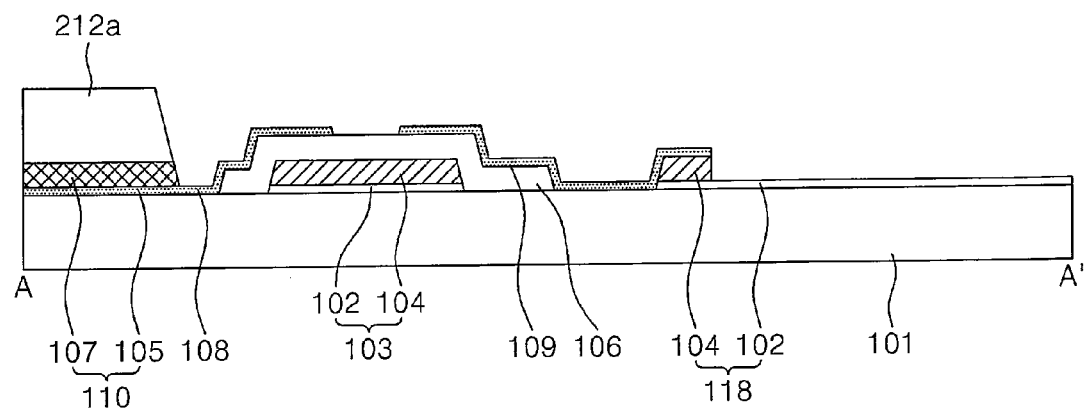

Referring to FIG. 12F, the revealed fourth conductive layer 107 and the second conductive layer 104 are removed by a third etch process using the first photoresist pattern 212a as a mask. In other words, the second conductive layer 104 of the pixel electrode 118 is removed except its portion connected to the drain electrode 109. Subsequently, the source and drain electrodes 108 and 109 are provided to the area from which the fourth conductive layer 107 is removed to oppose each other. The first photoresist pattern 212a formed on the fourth conductive layer 107 is removed by a stripping process. Hence, the data line 110 and the source and drain electrodes 108 and 109 of the organic TFT substrate are formed on the substrate 101 and the gate-insulating layer 106.

Figure 13:
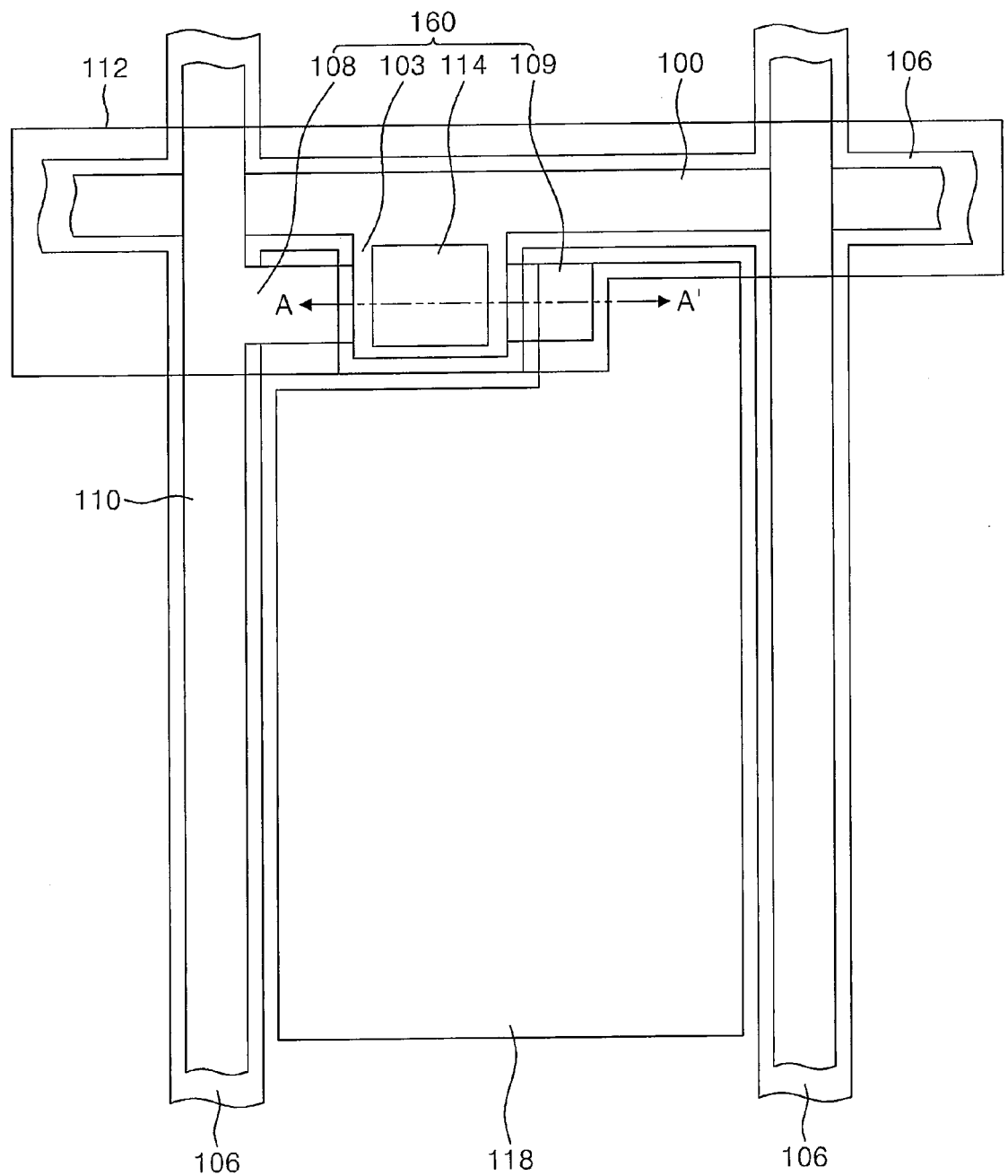
FIG. 13 and FIG. 14 are a layout and a cross-sectional diagram to explain steps of forming a bank-insulating layer, an organic semiconductor layer, and a passivation layer in a method of fabricating an organic TFT substrate according to a first embodiment of the present invention, respectively.
Figure 14:
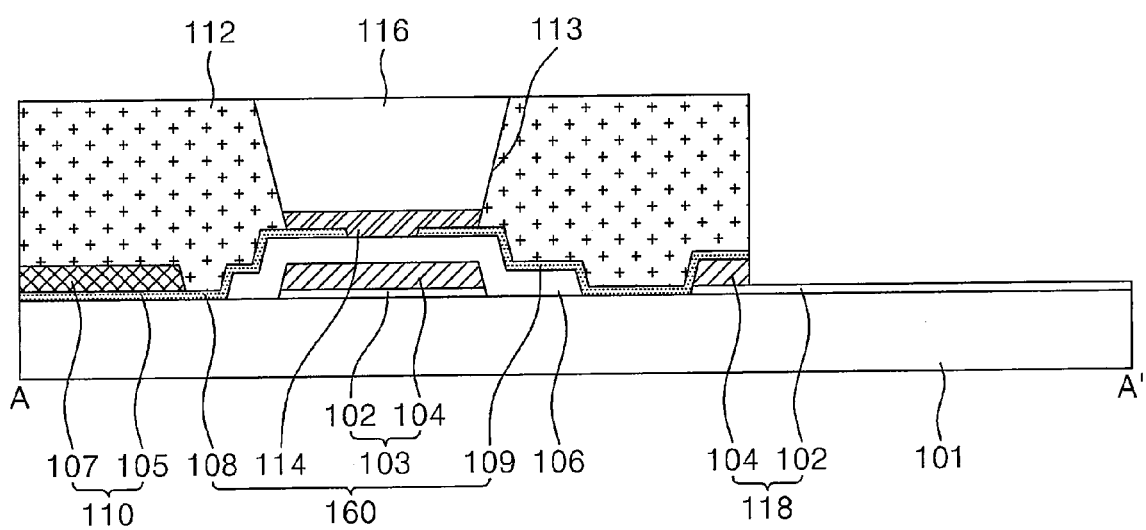

FIG. 13 and FIG. 14 are a layout and a cross-sectional diagram to explain the steps of forming a bank-insulating layer, an organic semiconductor layer, and a passivation layer, and FIGS. 15A to 15D are cross-sectional diagrams to explain details of the steps of forming the bank-insulating layer, organic semiconductor layer and passivation layer shown in FIG. 13 and FIG. 14.

Figure 15A:
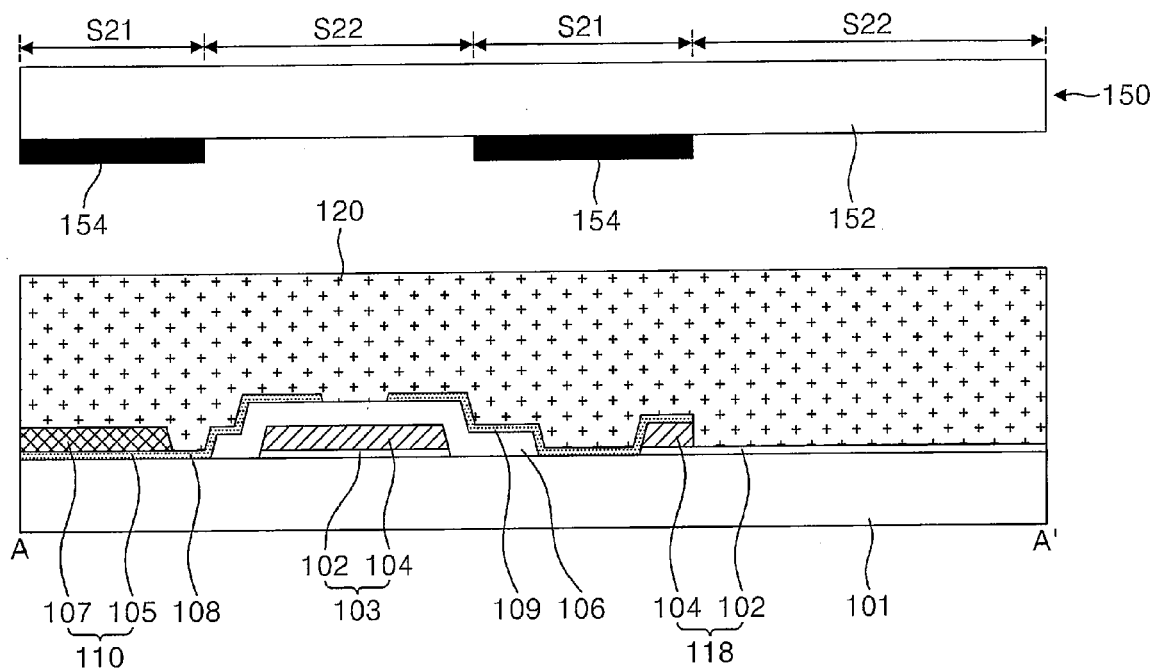
FIGS. 15A to 15D are cross-sectional diagrams to explain details of the steps of forming the bank-insulating layer, organic semiconductor layer and passivation layer shown in FIG. 13 and FIG. 14.
Figure 15B:
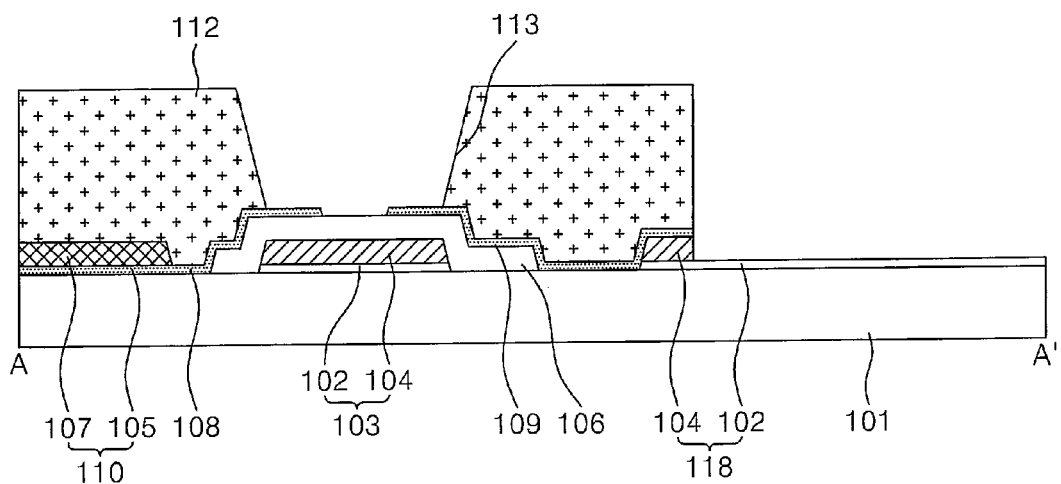
Figure 15C:
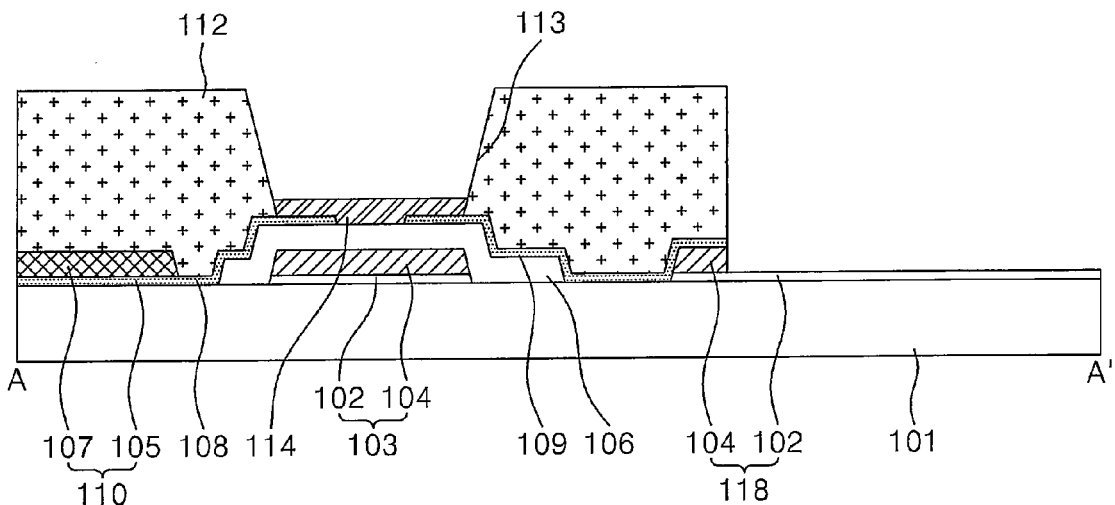
Figure 15D:
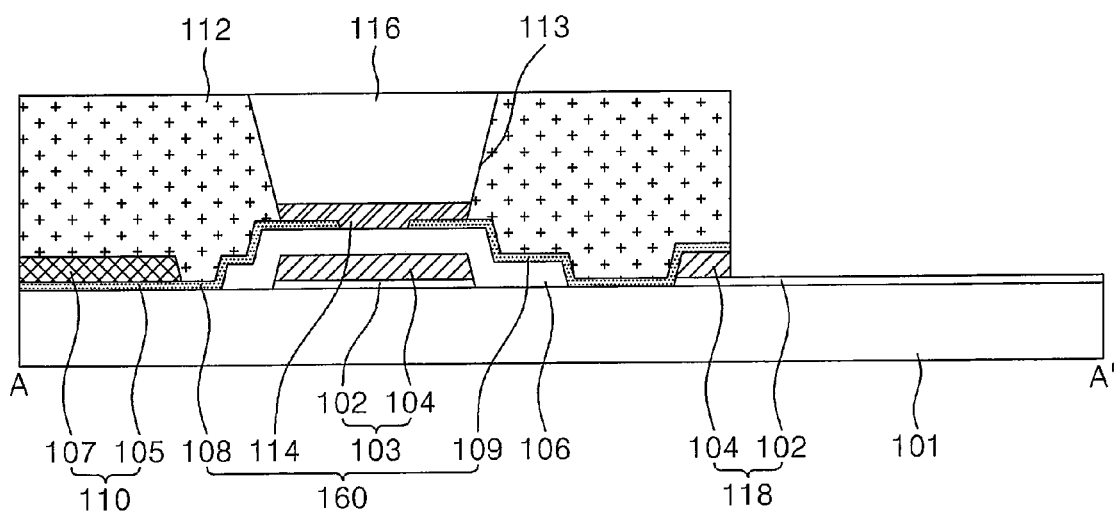

Referring to FIG. 15A, a photosensitive organic insulating substance 120 is coated over the substrate 101 including the source and drain electrodes 108 and 109, the data line 110, and the pixel electrode 118 by a spin or spinless coating method. Subsequently, a mask 150 is aligned over the substrate 101. The mask 150 includes a shield area S21 having a shield layer 154 on a quartz substrate 152 and a transmitting area S22 including the quartz substrate 152 only. The shield area S21 cuts off ultraviolet rays in the course of exposure to form a bank-insulating layer 112, as shown in FIG. 15B, on the substrate 101 corresponding to the shield area S21 after completion of development. The transmitting area S22 entirely transmits the ultraviolet rays in the course of the exposure to form a hole 113 over the substrate 101 corresponding to the transmitting area S22 after completion of the development. The hole 113 exposes the gate-insulating layer 106 and the source and drain electrodes 108 and 109. Subsequently, a liquid organic semiconductor is sprayed into the hole 113 provided by the bank-insulating layer 12 using an inkjet injector (not shown). As the liquid organic semiconductor is hardened, a solid organic semiconductor layer 114, as shown in FIG. 15C, is formed. After the organic semiconductor layer 114 has been formed, SAM is carried out on the organic semiconductor layer 114. The organic semiconductor layer 114 comes into ohmic contact with each of the source and drain electrodes 108 and 109. Subsequently, an organic insulating liquid such as polyvinyl acetate (PVA) is injected into the hole 113 provided by the bank-insulating layer 112 using the inkjet injector and then hardened. An organic passivation layer 116, as shown in FIG. 15D, is then formed within the hole 113 provided by the bank-insulating layer 112. Hence, the organic TFT substrate, as shown in FIG. 13 and FIG. 14, includes the bank-insulating layer 112, the organic semiconductor layer 114, and the organic passivation layer 116 on the data line 110, the source and drain electrodes 108 and 109.

A method of fabricating an organic TFT substrate according to a second embodiment of the present invention is explained in detail with reference to FIGS. 16 to 23 as follows.

The method of fabricating an organic TFT substrate in FIGS. 16 to 23 is identical to that in FIGS. 6 to 15D except that a contact hole 230 is formed in the gate-insulating layer 206. Details of the identical steps of the fabricating method are omitted in the following description.

Figure 16:
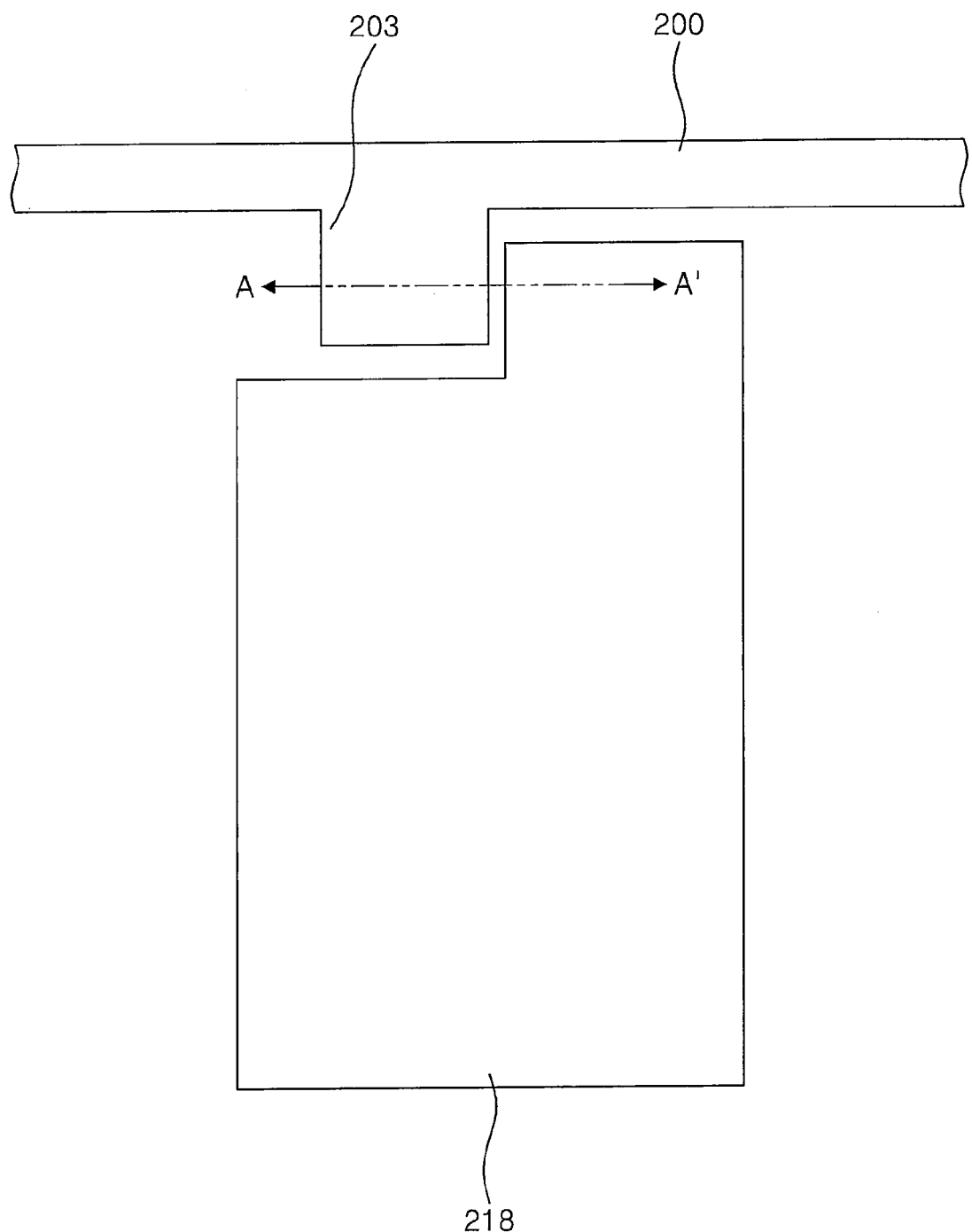
FIG. 16 and FIG. 17 are a layout and a cross-sectional diagram to explain a step of forming a metal gate pattern in a method of fabricating an organic TFT substrate according to a second embodiment of the present invention, respectively.
Figure 17:
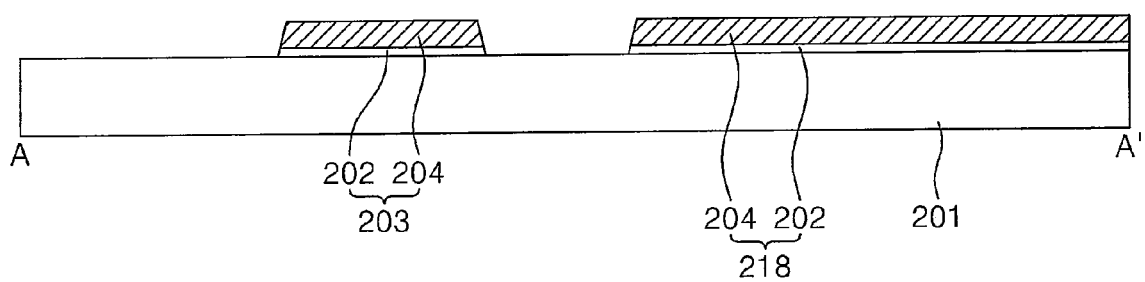

FIG. 16 and FIG. 17 are a layout and a cross-sectional diagram to explain the step of forming a metal gate pattern according to a second embodiment of the present invention, respectively.

Referring to FIG. 16 and FIG. 17, a metal gate pattern including a gate line 200, a gate electrode 203, and a pixel electrode 218 formed by stacking a first conductive layer 202 and a second conductive layer 204 sequentially on a substrate 201 by a first masking process. The first conductive layer 202 and the second conductive layer 204 are sequentially deposited on the substrate 201 by sputtering and then patterned by photolithography to form the metal gate pattern.

Figure 18:
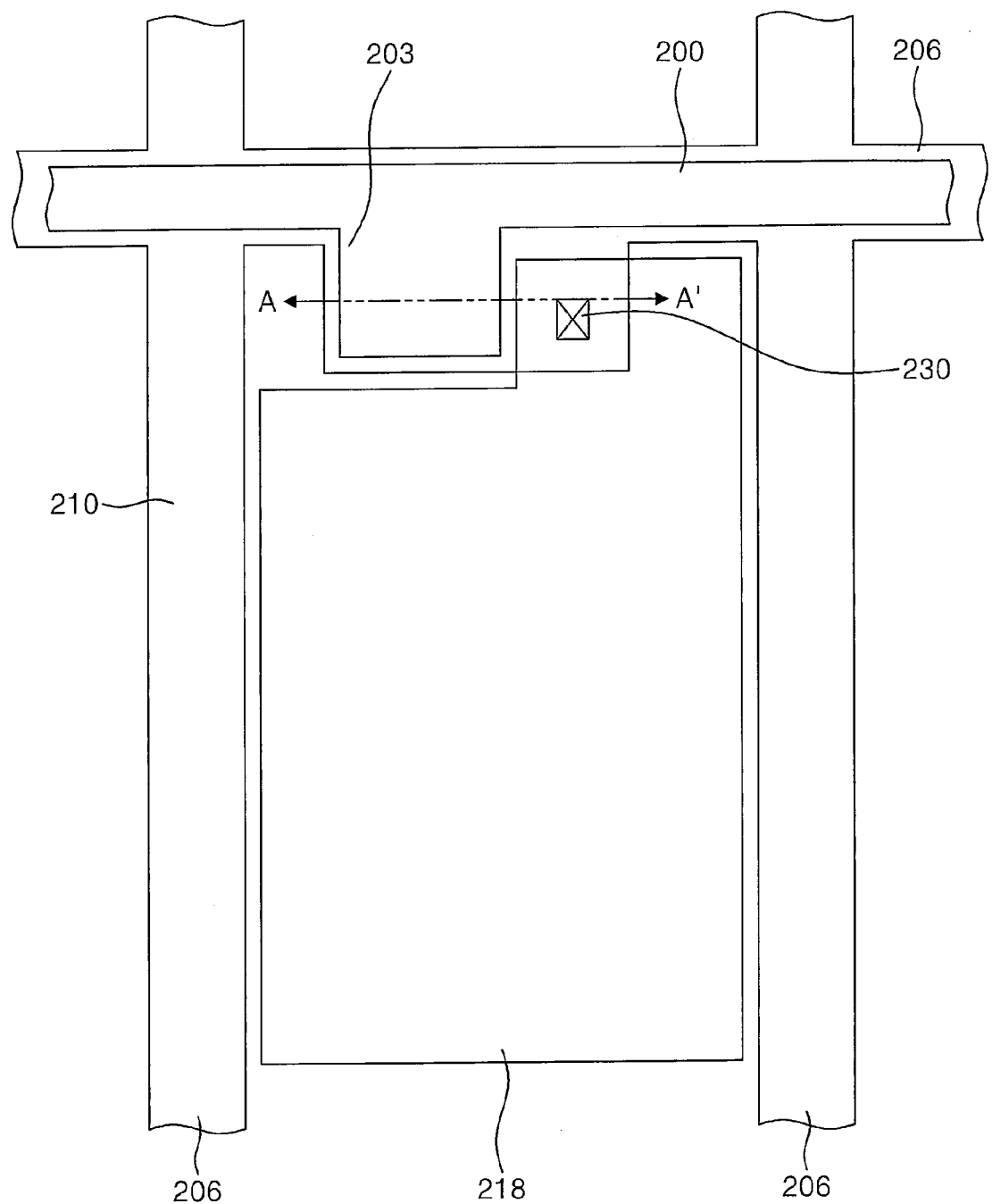
FIG. 18 and FIG. 19 are a layout and a cross-sectional diagram to explain a step of forming a gate-insulating layer in a method of fabricating an organic TFT substrate according to a second embodiment of the present invention, respectively.
Figure 19:
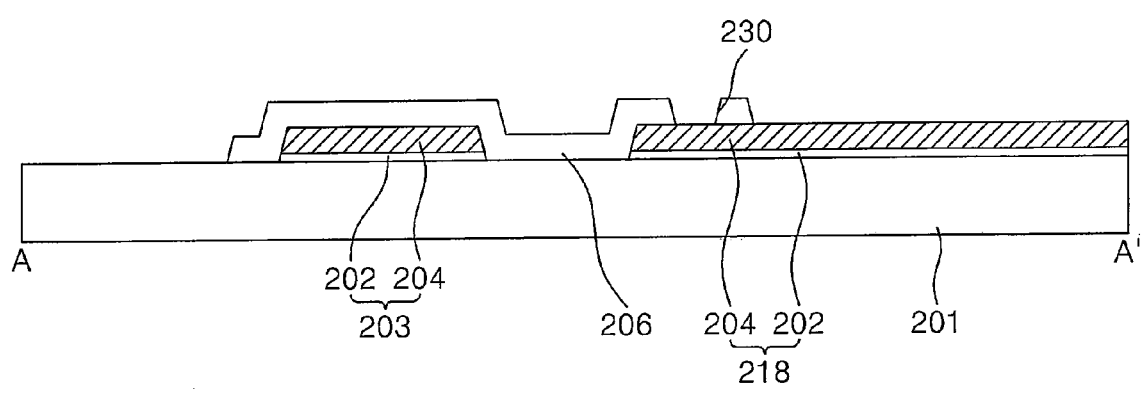

FIG. 18 and FIG. 19 are a layout and a cross-sectional diagram to explain a step of forming a gate-insulating layer in a method of fabricating an organic TFT substrate according to a second embodiment of the present invention, respectively.

Referring to FIG. 18 and FIG. 19, a gate-insulating layer 206 is formed on the substrate 201 including the metal gate pattern by a second mask process. An inorganic gate-insulating layer formed of silicon nitride or the like is formed on the substrate 201 including the metal gate pattern 201 by deposition such as PECVD and the like for example. Alternatively, the gate-insulating layer 206 can be formed of an organic insulating substance such as PVP and the like by coating such as spin coating. The gate-insulating layer 206 is formed on the pixel electrode 218 to prevent the pixel electrode 218 from being etched in the course of etching the drain electrode. Moreover, the gate-insulating layer 206 includes a contact hole 230 to enable the pixel electrode 218 to be connected to the drain electrode 209.

Figure 20:
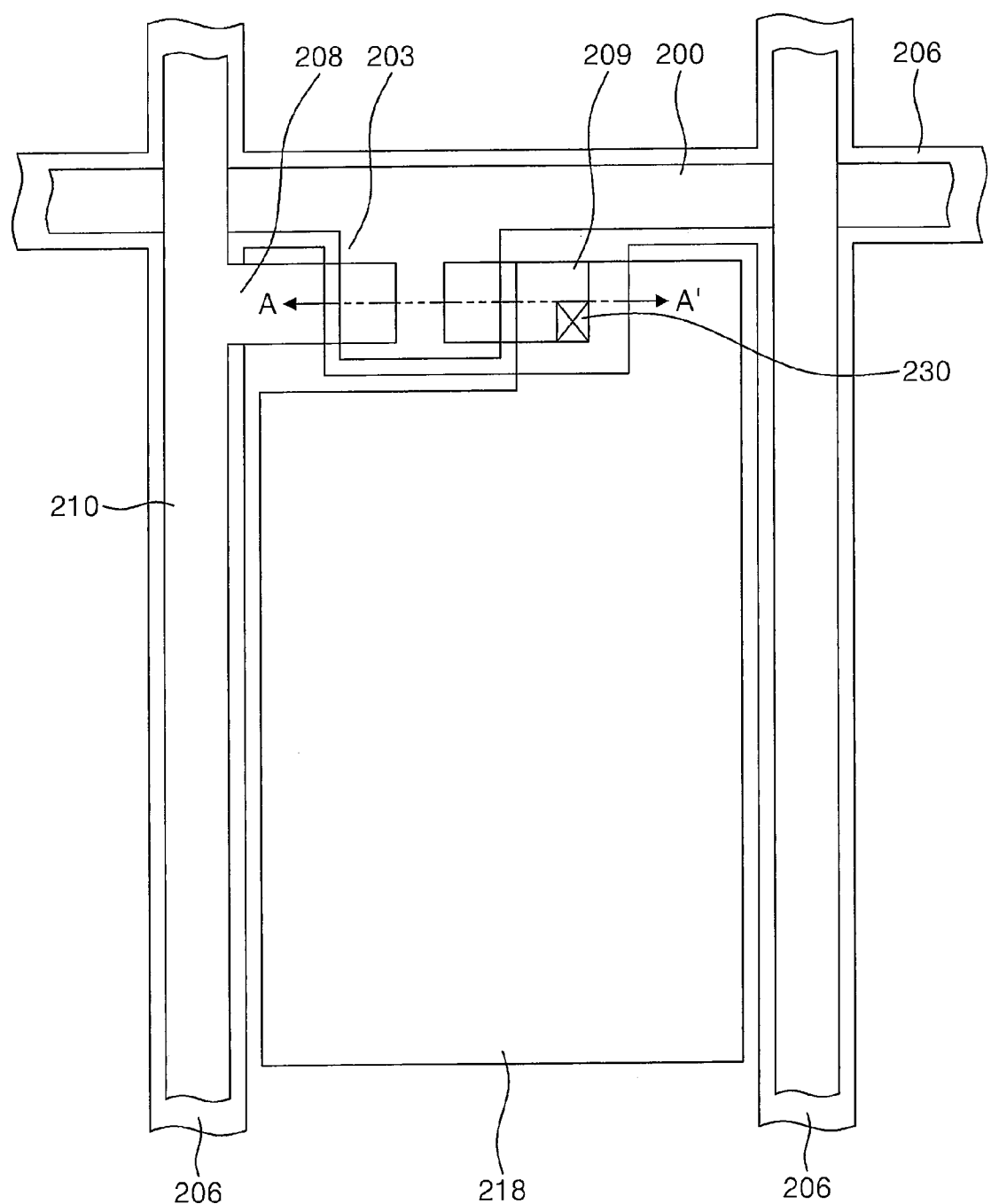
FIG. 20 and FIG. 21 are a layout and a cross-sectional diagram to explain steps of forming a data line, a source electrode, and a drain electrode in a method of fabricating an organic TFT substrate according to a second embodiment of the present invention, respectively.
Figure 21:
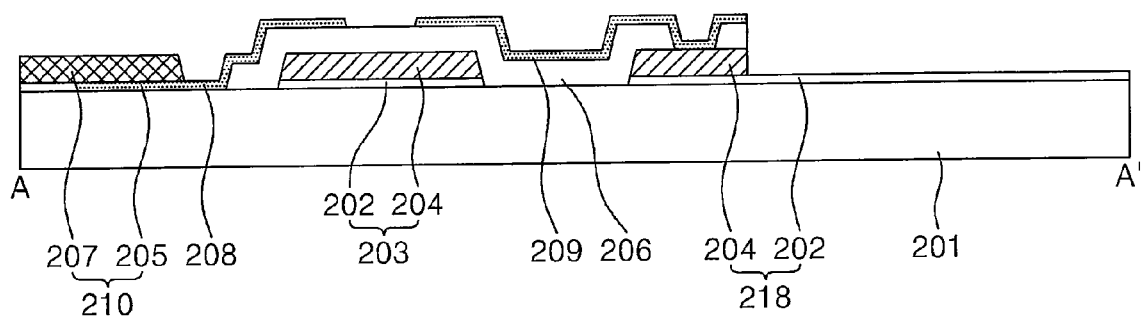

FIG. 20 and FIG. 21 are a layout and a cross-sectional diagram to explain steps of forming a data line, a source electrode, and a drain electrode in a method of fabricating an organic TFT substrate according to a second embodiment of the present invention, respectively.

Referring to FIG. 20 and FIG. 21, a data line 210 including the third conductive layer 205 and the fourth conductive layer 207 stacked on the third conductive layer 205 and source and drain electrodes 208 and 209 including the third conductive layer 205 are formed on the gate-insulating layer 206 by a third mask process. The third and fourth conductive layers 205 and 207 are stacked on the gate-insulating layer 206 by deposition such as sputtering and then patterned by photolithography to form the data line 210 and the source and drain electrodes 208 and 209.

Figure 22:
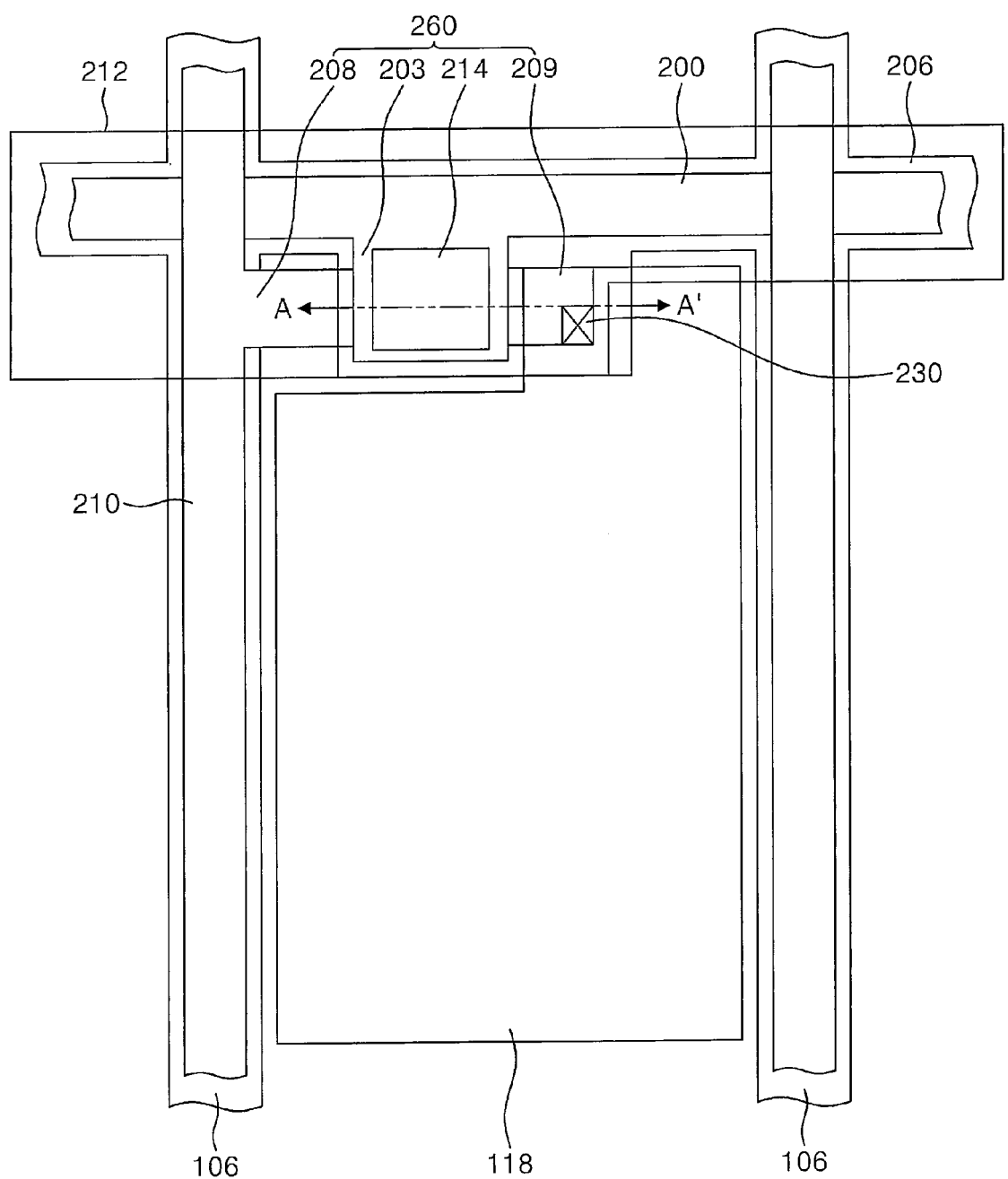
FIG. 22 and FIG. 23 are a layout and a cross-sectional diagram to explain steps of forming a bank-insulating layer, an organic semiconductor layer, and a passivation layer in a method of fabricating an organic TFT substrate according to a second embodiment of the present invention, respectively.
Figure 23:
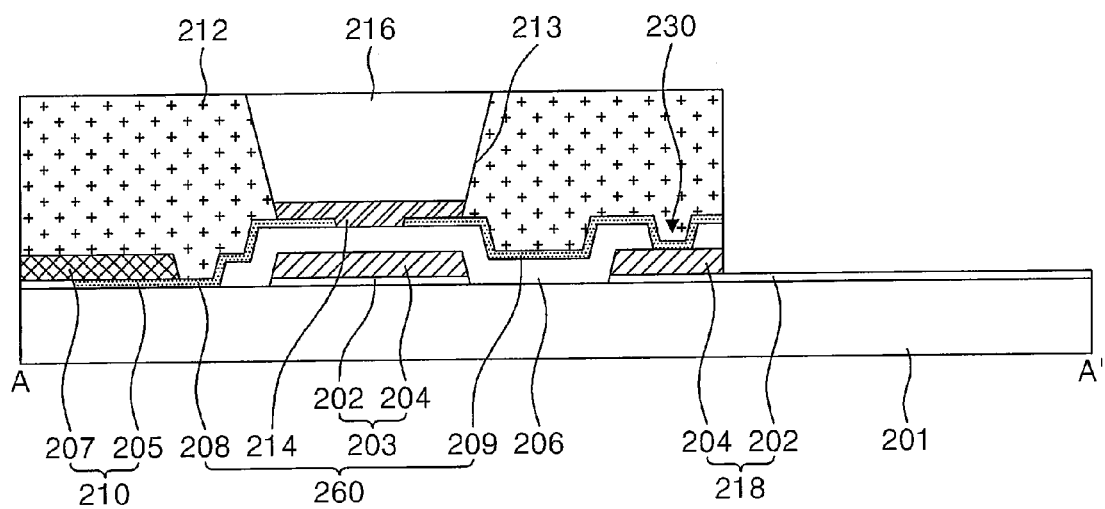

FIG. 22 and FIG. 23 are a layout and a cross-sectional diagram to explain steps of forming a bank-insulating layer, an organic semiconductor layer, and a passivation layer according to a second embodiment of the present invention, respectively.

Referring to FIG. 22 and FIG. 23, a bank-insulating layer 212, an organic semiconductor layer 214, and an organic passivation layer 216 are formed over the substrate 201 including the source and drain electrodes 208 and 209, the data line 210, and the pixel electrode 218 by a fourth mask process. After an organic insulating substance has been formed over the substrate 210 including the source and drain electrodes 208 and 209, the data line 210, and the pixel electrode 218, a hole 213 exposing the source and drain electrodes 208 and 209 is formed by photolithography. An organic semiconductor is injected into the hole 213 using an inkjet injector to form an organic semiconductor layer 214. An organic passivation layer 216 is then formed on the organic semiconductor layer 214.

Accordingly, the present invention provides the following effects or advantages.

A pixel electrode is formed in the same plane as the gate line and electrode to reduce the number of masks used in fabricating an organic TFT substrate, whereby fabrication cost and time can be reduced. And, stability can be also achieved against chemical and plasma exposures.

Secondly, an organic TFT substrate provided by the present invention facilitates a turn-on operation of an organic TFT.

While the organic TFT has been described as being applied to the LCD device, the organic TFT may be applicable to other display devices which use a TFT as a switching element, such as organic light emitting diode display ("OLED") devices, electrophoretic display devices ("EPD").

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic TFT substrate comprising:
   a gate line on a substrate;
   a pixel electrode in a same plane of the gate line;
   a gate-insulating layer on the gate line;
   a data line on the gate-insulating layer to cross with the gate line;
   an organic TFT including a gate electrode connected to the gate line, a source electrode connected to the data line insulated from the gate line, a drain electrode connected to the pixel electrode insulated from the gate electrode, and an organic semiconductor layer making contact with a portion of the source electrode and the drain electrode and the gate-insulating layer; and
   a bank insulating layer provide with a hole to expose a portion of the source electrode and the drain electrode on the organic TFT,
   wherein the organic semiconductor layer is formed within the hole.

2. The organic TFT substrate of claim 1, wherein each of the gate line and the gate electrode is configured to have a double-layer structure comprising a first conductive layer and a second conductive layer stacked on the first conductive layer.

3. The organic TFT substrate of claim 2, wherein the first conductive layer comprises a transparent conductive layer and wherein the second conductive layer comprises an opaque metal layer.

4. The organic TFT substrate of claim 3, wherein the pixel electrode is formed of a same substance of the gate line.

5. The organic TFT substrate of claim 1, wherein the gate-insulating layer is formed on the pixel electrode overlapped with the drain electrode of the organic TFT.

6. The organic TFT substrate of claim 5, wherein the pixel electrode and the drain electrode are connected to each other via a contact hole formed on the gate-insulating layer.

7. The organic TFT substrate of claim 1, wherein the gate-insulating layer is formed of an inorganic substance.

8. The organic TFT substrate of claim 7, wherein the gate-insulating layer is formed of silicon nitride ($SiN_x$).

9. The organic TFT substrate of claim 1, wherein the gate-insulating layer is formed of an organic substance.

10. The organic TFT substrate of claim 1, wherein the data line is configured to have a multi-layer structure of at least two layers including a transparent conductive layer.

11. The organic TFT substrate of claim 10, wherein the data line comprising:
    a third conductive layer comprising a transparent conductive material; and
    a fourth conductive layer on the third conductive layer formed of an opaque metal.

12. The organic TFT substrate of claim 11, wherein the source and drain electrodes of the organic TFT are formed of the same substance as the third conductive layer of the data line.

13. The organic TFT substrate of claim 9, wherein the gate-insulating layer is formed of the organic substance selected from the group consisting of polyvinyl pyrrolidone (PVP), polyvinyl acetate (PVA), phenol based polymer, acryl based polymer, imide based polymer, allyl ether based polymer, amide based polymer, fluorine based polymer, and vinyl alcohol based polymer.

14. A method of fabricating an organic TFT substrate, comprising:
    forming a gate line, a gate electrode connected to the gate line, and a pixel electrode in the same plane of the gate line on a substrate;
    forming a gate-insulating layer on the gate line and the gate electrode;
    forming a data line, a source electrode connected to the data line insulated from the gate line, and a drain electrode connected to the pixel electrode on a portion of the gate-insulating layer;
    forming a bank insulating layer on a portion of the source electrode and the drain electrode, the bank insulating layer being provided with a hole to partially expose the source electrode and the drain electrode; and
    forming an organic semiconductor layer with the hole to make contact with the gate-insulating layer and the source electrode and the drain electrode.

15. The method of claim 14, wherein the gate line and the gate electrode have a double-layer structure comprising a first conductive layer and a second conductive layer stacked on the first conductive layer.

16. The method of claim 15, wherein the gate-insulating layer is formed of an inorganic substance.

17. The method of claim 16, wherein the forming the gate-insulating layer comprises forming the gate-insulating layer of silicon nitride ($SiN_x$).

18. The method of claim 14, wherein the forming the gate-insulating layer is formed of an organic substance.

19. The method of claim 14, wherein the gate-insulating layer is provided with a contact hole on the pixel electrode.

20. The method of claim 14, further comprising:
    forming a bank-insulating layer provided with a hole to be filled with the organic semiconductor layer before forming the organic semiconductor layer; and
    forming an organic passivation layer within the hole filled with the organic semiconductor layer.

21. The method of claim 14, wherein the gate line, the gate electrode and the pixel electrode are formed by a first mask process, the gate-insulating layer is formed by a second mask process, the data line, the source electrode and the drain electrode are formed by a third process, and the bank insulating layer and the organic semiconductor layer are formed by a fourth process.

* * * * *